(12) United States Patent
Mihara

(10) Patent No.: US 7,528,480 B2
(45) Date of Patent: May 5, 2009

(54) CIRCUIT BOARD, SEMICONDUCTOR DEVICE, AND MANUFACTURING METHOD OF CIRCUIT BOARD

(75) Inventor: Ichiro Mihara, Tachikawa (JP)

(73) Assignee: Casio Computer Co., Ltd., Tokyo (JP)

( * ) Notice: Subject to any disclaimer, the term of this patent is extended or adjusted under 35 U.S.C. 154(b) by 75 days.

(21) Appl. No.: 11/645,044

(22) Filed: Dec. 22, 2006

(65) Prior Publication Data

US 2007/0145518 A1    Jun. 28, 2007

(30) Foreign Application Priority Data

Dec. 28, 2005   (JP) .............................. 2005-378530

(51) Int. Cl.
*H01L 23/12* (2006.01)
*H01L 23/053* (2006.01)
(52) U.S. Cl. ............ 257/700; 257/777; 257/778; 257/737; 257/738; 257/E23.008; 257/E21.511
(58) Field of Classification Search ............ 257/774, 257/700, 499; 216/18; 29/843; 438/612, 438/613, 614
See application file for complete search history.

(56) References Cited

U.S. PATENT DOCUMENTS

2003/0160325 A1* 8/2003 Yoneda et al. ............. 257/758
2004/0106335 A1* 6/2004 Nemoto et al. ............. 439/894
2005/0121768 A1* 6/2005 Edelstein et al. .......... 257/698

FOREIGN PATENT DOCUMENTS

JP   2001-326305 A   11/2001

* cited by examiner

*Primary Examiner*—W. David Coleman
*Assistant Examiner*—Shaka Scarlett
(74) *Attorney, Agent, or Firm*—Frishauf, Holtz, Goodman & Chick, P.C.

(57) ABSTRACT

A circuit board includes a semiconductor substrate which has a plurality of through holes passing from an upper surface to a lower surface thereof. A plurality of wiring lines are provided on the upper surface of the semiconductor substrate and have bottomed cylindrical portions located within regions corresponding to the through holes. Bottom surfaces of the bottomed cylindrical portions of the wiring lines serve as connection pad portions.

10 Claims, 30 Drawing Sheets

CIRCUIT BOARD, SEMICONDUCTOR DEVICE, AND MANUFACTURING METHOD OF CIRCUIT BOARD

CROSS-REFERENCE TO RELATED APPLICATIONS

This application is based upon and claims the benefit of priority from prior Japanese Patent Application No. 2005-378530, filed Dec. 28, 2005, the entire contents of which are incorporated herein by reference.

BACKGROUND OF THE INVENTION

1. Field of the Invention

This invention relates to a circuit board, a semiconductor device, and a manufacturing method of the circuit board.

2. Description of the Related Art

A chip scale package (CSP) has been known as a mounting structure of an electronic equipment suitable for the size reduction of the electronic equipment. The CSP has a structure in which a semiconductor chip is bonded face down to a substrate having substantially the same area as the semiconductor chip, generally a relay substrate called an interposer and in which the semiconductor chip is connected to a printed wiring board via wiring lines and via holes provided in the interposer. Jpn. Pat. Appln. KOKAI Publication No. 2001-326305 discloses a representative CSP. In this prior art document, the substrate of the interposer is made of silicon. Since the silicon substrate is used, both surfaces of the substrate can be smoothed by polishing the substrate, and micropatterns can be easily formed, and moreover, flexure and bending can be held down even if the thickness of the substrate is reduced. An upper wiring line and a lower wiring line are respectively provided on the upper surface and lower surface of the silicon substrate. The upper wiring line is connected to the corresponding lower wiring line via a cylindrical vertical conductor provided in the inner wall surface of a through hole formed in the silicon substrate. Solder balls are provided under connection pad portions of the lower wiring line.

In the conventional semiconductor device, pads provided on the lower surface of the semiconductor chip are bonded to the connection pad portions of the lower wiring line of the interposer such that the semiconductor chip is installed on the interposer, and the solder balls of the interposer are bonded to connection terminals on the printed wiring board such that the semiconductor chip is mounted on the printed wiring board via the interposer.

In the conventional semiconductor device, since the vertical conductor of the interposer is cylindrical, a solder ball can not be provided in the lower part of this cylindrical vertical conductor. Thus, the solder balls are provided under the connection pad portions of the lower wiring line connected to the vertical conductor, and because a region is required to dispose the lower wiring line, there is a problem that the area of the interposer is increased and the whole semiconductor device is thus increased in size.

BRIEF SUMMARY OF THE INVENTION

It is therefore an object of this invention to provide a circuit board, a semiconductor device and a manufacturing method of the circuit board which enables a size reduction.

According to one aspect of this invention, there is provided a circuit board comprising:

a semiconductor substrate which includes a plurality of through holes passing from an upper surface to a lower surface thereof; and a plurality of wiring lines which are provided on the upper surface of the semiconductor substrate and which have bottomed cylindrical portions located in regions corresponding to the through holes, wherein bottom surfaces of the bottomed cylindrical portions of the wiring lines serve as connection pad portions.

According to this invention, since the bottom surfaces of the bottomed cylindrical portions of the wiring lines formed within the regions corresponding to the through holes of the semiconductor substrate serve as the connection pad portions, it is not necessary to provide a lower wiring line having a connection pad portion under the semiconductor substrate, and the area of the semiconductor substrate can be reduced accordingly, and moreover, a size reduction can be achieved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

Figure 1:
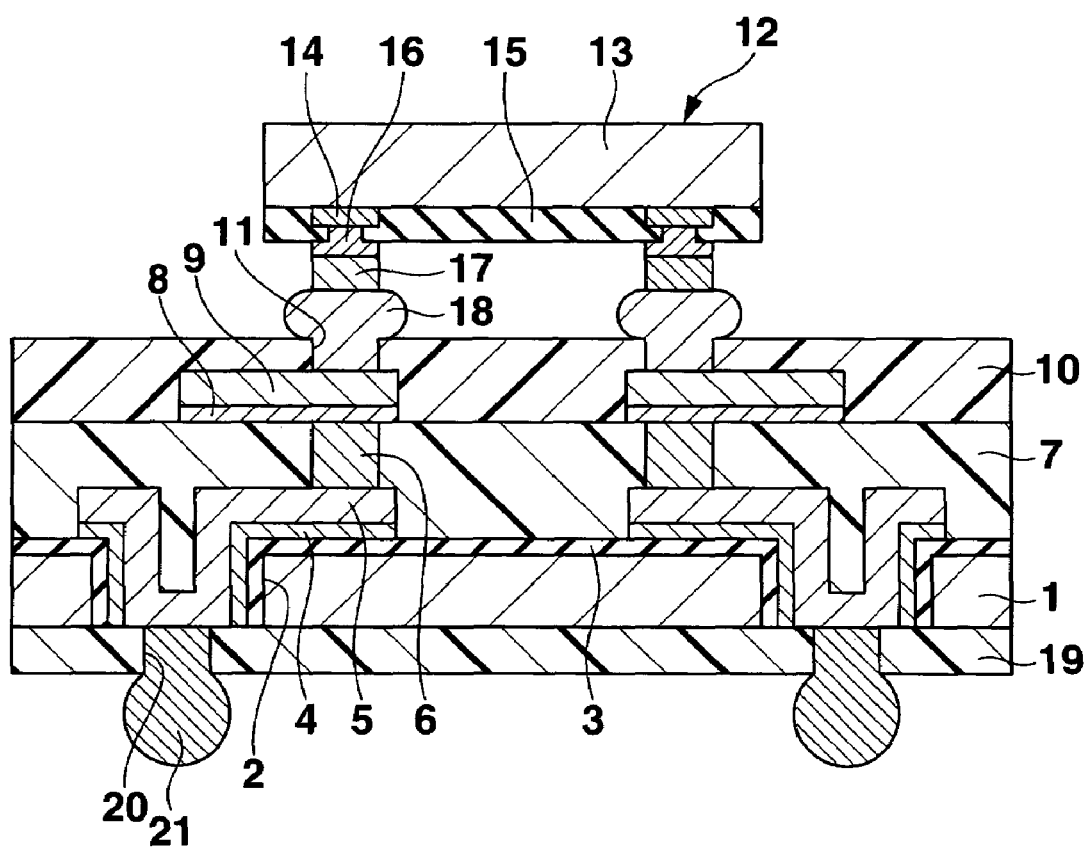
FIG. 1 is a sectional view of a semiconductor device as a first embodiment of this invention.

FIG. 1 shows a sectional view of a semiconductor device as a first embodiment of this invention. This semiconductor device includes a silicon substrate (semiconductor substrate) 1 as a simple planar square substrate. The silicon substrate 1 simply has a function as a substrate, and no electronic element such as an integrated circuit is formed on the surface of the substrate. Through holes 2 having a cross-section of a predetermined shape such a circular shape are provided at a plurality of places in the silicon substrate 1. A foundation insulating film 3 made of, for example, silicon oxide is provided on the inner wall surfaces of the through holes 2 and the upper surface of the silicon substrate 1. In this case, parts of the foundation insulating film 3 provided on the inner wall surfaces of the through holes 2 are cylindrical.

A first foundation metal layer 4 made of, for example, copper is provided on the inner wall surfaces of the cylindrical parts of the foundation insulating film 3 within the through holes 2, and on parts of the upper surface of the foundation insulating film 3 near the through holes. In this case, parts of the first foundation metal layer 4 provided on the inner wall surfaces of the cylindrical parts of the foundation insulating film 3 within the through holes 2 are also cylindrical. A first wiring line 5 made of copper is provided all over the inner wall surface of the cylindrical part of the first foundation metal layer 4 within each of the through holes 2 and the upper surface of the first foundation metal layer 4. The first wiring line 5 provided on the cylindrical inner wall surface of the first foundation metal layer 4 within the through hole 2 has a bottomed cylindrical shape with a bottom contacting a lower overcoat film 19 described later, and entirely blocks the lower part of the through hole 2. The lower surfaces of the parts of the foundation insulating film 3, the first foundation metal layer 4 and the first wiring line 5 which are provided within the through hole 2 are flush with the lower surface of the silicon substrate 1.

A columnar electrode 6 made of copper is provided on the upper surface of a connection pad portion of the first wiring line 5. The height of the columnar electrode 6 is not limited to but is generally 50 to 150 μm. An insulating film 7 made of, for example, a polyimide-based resin is provided on the upper surfaces of the first wiring lines 5 and the foundation insulating film 3 so that the upper surface of this insulating film 7 is flush with the upper surfaces of the columnar electrodes 6. A second foundation metal layer 8 made of, for example, copper is provided on the upper surface of each of the columnar electrodes 6 and a part of the upper surface of the insulating film 7. A second wiring line 9 made of copper is provided all over the upper surface of the second foundation metal layer 8. An upper overcoat film 10 made of, for example, a solder resist is provided on the upper surfaces of the second wiring lines 9 and the insulating film 7. Openings 11 are formed in the upper overcoat film 10 in parts corresponding to connection pad portions of the second wiring lines 9.

A semiconductor construct 12 is installed on the upper overcoat film 10. In this case, the semiconductor construct 12 is what is generally called a bare chip, and has a structure as follows. A plurality of connection pads 14 are provided on peripheral parts of the lower surface of a silicon substrate (semiconductor substrate) 13. An insulating film 15 made of, for example, silicon oxide is provided on the connection pads 14 except for the centers of the connection pads 14 and on the lower surface of the silicon substrate 13. A lower metal layer 16 made of, for example, copper is provided on the lower surface of each of the connection pads 14 and a lower connection pad 17 made of copper is provided on the lower surface of the lower metal layer 16 so that the lower metal layer 16 and the lower connection pad 17 are electrically connected to the connection pad 14. A solder ball 18 is provided on the lower surface of the lower connection pad 17.

An integrated circuit (not shown) having a predetermined function is provided on the lower surface of the silicon substrate 13. The connection pads 14 are electrically connected to this integrated circuit. The semiconductor construct 12 is installed on the upper overcoat film 10 in such a condition that the solder balls 18 thereof are bonded onto the upper surfaces of the connection pad portions of the second wiring lines 9 via the openings 11 of the upper overcoat film 10.

The lower overcoat film 19 made of, for example, a solder resist is provided on the lower surfaces of parts of the foundation insulating film 3, the first foundation metal layer 4 and the first wiring line 5 provided within the through hole 2 of the silicon substrate 1 and on the lower surface of the silicon substrate 1. Openings 20 are provided in the lower overcoat film 19 in parts corresponding to the centers (connection pad portions) of the lower surfaces of the bottomed cylindrical first wiring lines 5 within the through holes 2 of the silicon substrate 1. Solder balls 21 are provided within and under the openings 20 of the lower overcoat film 19 so that these solder balls 21 are connected to the centers (connection pad portions) of the lower surfaces in the lower portions of the bottomed cylindrical first wiring lines 5 within the through holes 2 of the silicon substrate 1.

Figure 2:
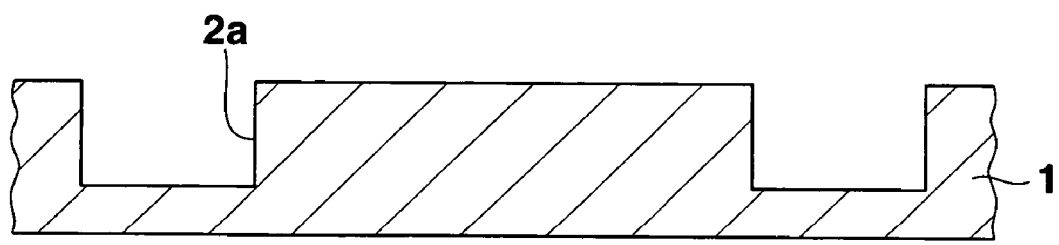
FIG. 2 is a sectional view of an initially prepared material in one example of a method of manufacturing the semiconductor device shown in FIG. 1.

Next, one example of a method of manufacturing this semiconductor device will be described. First, as shown in FIG. 2, the silicon substrate 1 in a wafer state (in the specification of the present application, the silicon substrate 1 in the wafer state means a silicon wafer having a plurality of silicon substrates) is prepared. In this case, the thickness of the silicon substrate 1 in the wafer state is somewhat lager than the thickness of the silicon substrate 1 shown in FIG. 1. Then, by, for example, laser processing in which a laser beam is applied, cylindrical recesses 2a having a certain degree of depth are formed in regions of the upper surface of the silicon substrate 1 where the through holes 2 are to be formed. Here, by way of example, when the thickness of the silicon substrate 1 in the wafer state is 300 to 500 μm, the depth of the recesses 2a is about 200 to 300 μm. That is, the thickness of the silicon substrate 1 in the parts where the recesses 2a are formed is 50 to 200 μm. The diameter of the recess 2a is 30 to 70 μm.

Figure 3:
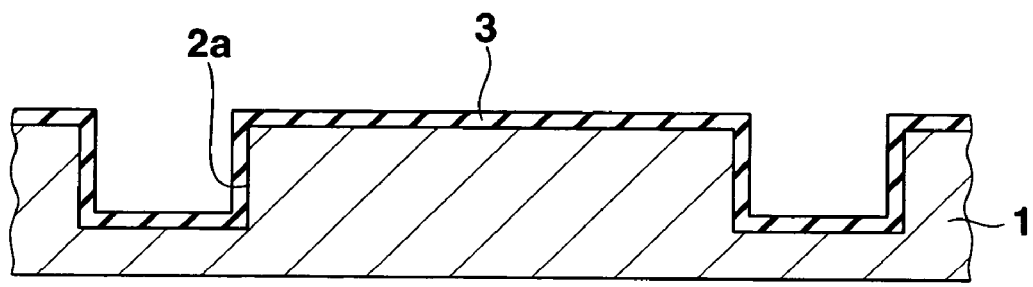
FIG. 3 is a sectional view of an assembly for explaining a step following FIG. 2.

Next, as shown in FIG. 3, the foundation insulating film 3 is formed all over the inner surfaces of the recesses 2a and the upper surface of the silicon substrate 1. In this case, the material and formation method of the foundation insulating film 3 may be selected in accordance with the aspect ratio of the recesses 2a. For example, when the aspect ratio of the recesses 2a is relatively high, an inorganic material such as silicon oxide may be formed into a film by a CVD method. On the other hand, when the aspect ratio of the recesses 2a is relatively low, an organic material such as a polyimide-based resin may be applied by, for example, a screen printing method.

Figure 4:
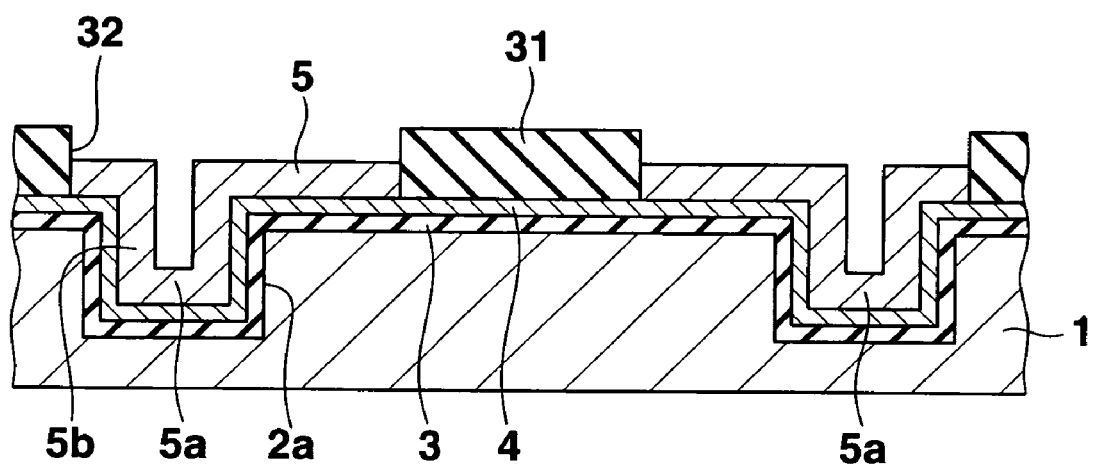
FIG. 4 is a sectional view of an assembly for explaining a step following FIG. 3.

Next, as shown in FIG. 4, the first foundation metal layer 4 (to be precise, a single layer to form a plurality of foundation metal layers 4) is formed all over the upper surface of the foundation insulating film 3. In this case, the first foundation metal layer 4 may only be a copper layer formed by electroless plating, or may only be a copper layer formed by a sputtering method, or may be a copper layer formed by the sputtering method on a thin film layer of, for example, titanium formed by the sputtering method.

Next, a plating resist film 31 is formed on the upper surface of the first foundation metal layer 4, and patterned. Due to this patterning, an opening 32 is formed in a part of the plating resist film 31 corresponding to the region where the first wiring line 5 is to be formed. Then, the electrolytic plating of copper is carried out using the first foundation metal layer 4 as a plating current path, such that the first wiring line 5 is formed on the upper surface of the first foundation metal layer 4 including the inside of the opening 32 of the plating resist film 31. The first wiring line 5 has flat portions along the upper surface of the silicon substrate 1 in parts corresponding to the upper surface of the silicon substrate 1, and has, in a part corresponding to the recess 2a of the silicon substrate, a bottomed cylindrical portion with a bottom portion 5a formed to correspond to the bottom surface of the recess 2a and with a cylindrical side portion 5b formed to correspond to the side surface of the recess 2a. Then, the plating resist film 31 is released.

Figure 5:
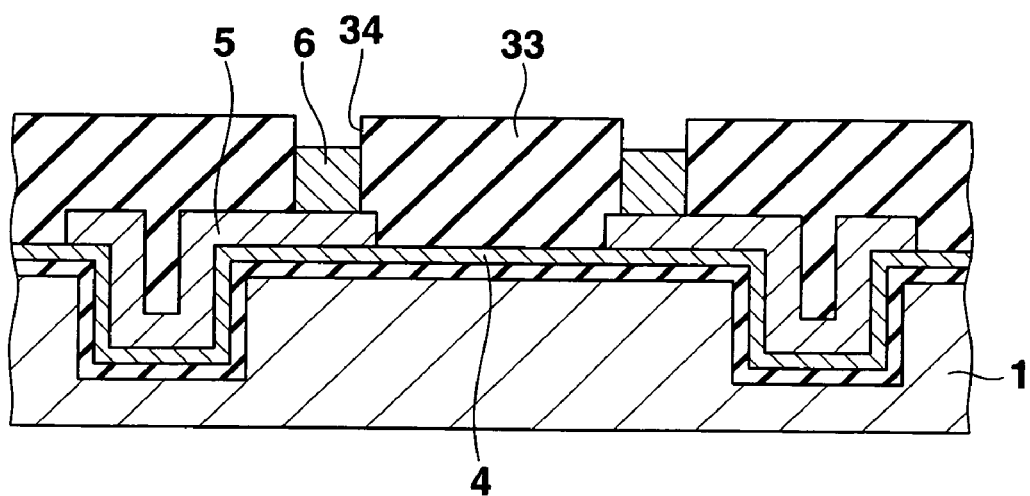
FIG. 5 is a sectional view of an assembly for explaining a step following FIG. 4.
Figure 6:
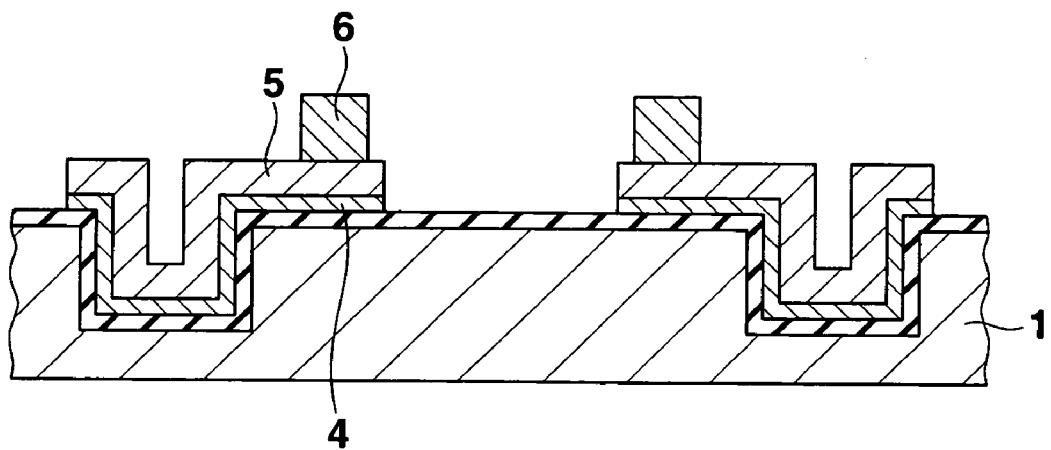
FIG. 6 is a sectional view of an assembly for explaining a step following FIG. 5.

Next, as shown in FIG. 5, a plating resist film 33 is formed on the upper surface of the first foundation metal layer 4 including the first wiring line 5, and patterned. Due to this patterning, an opening 34 is formed in a part of the plating resist film 33 corresponding to the region where the columnar electrode 6 is to be formed. Then, the electrolytic plating of copper is carried out using the first foundation metal layer 4 as a plating current path, such that the columnar electrode 6 is formed on the upper surface of the connection pad portion of the first wiring line 5 within the opening 34 of the plating resist film 33. Subsequently, the plating resist film 33 is released, and unnecessary parts of the first foundation metal layer 4 are etched and removed using the first wiring line 5 as a mask, so that the first foundation metal layer 4 remains only under the first wiring line 5, as shown in FIG. 6.

Figure 7:
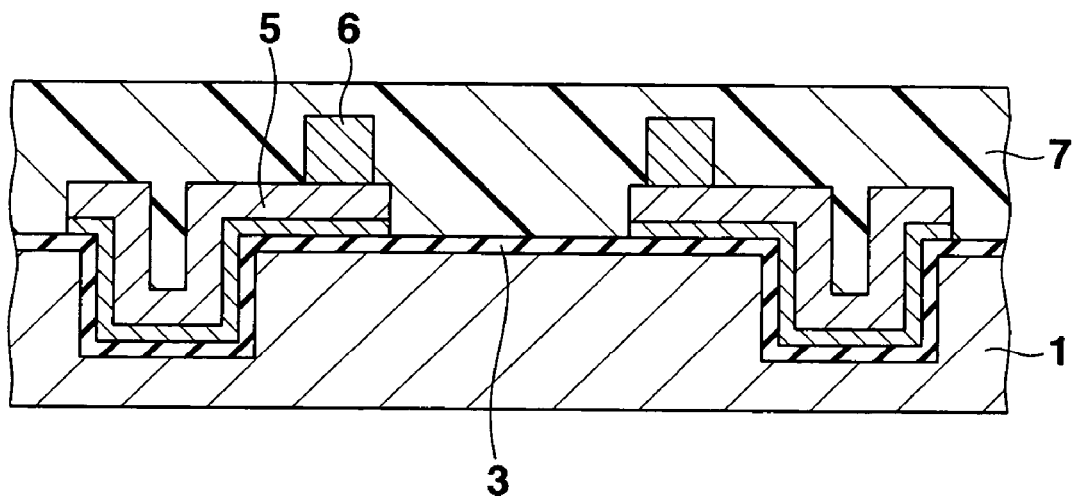
FIG. 7 is a sectional view of an assembly for explaining a step following FIG. 6.
Figure 8:
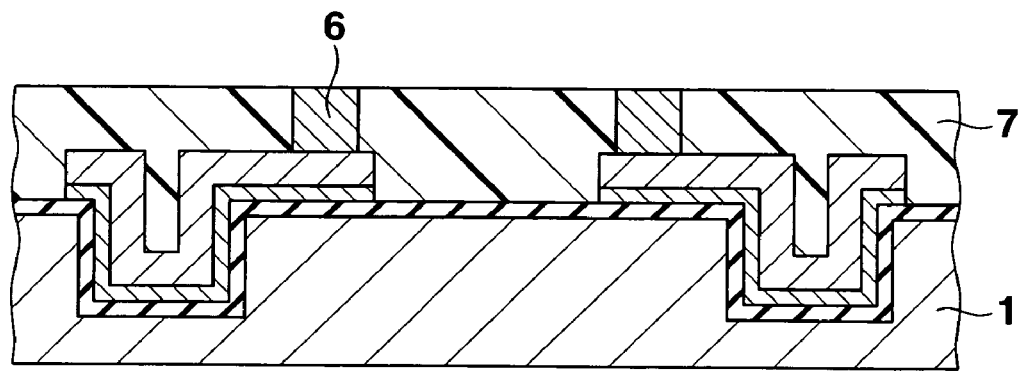
FIG. 8 is a sectional view of an assembly for explaining a step following FIG. 7.

Next, as shown in FIG. 7, the insulating film 7 made of, for example, a polyimide-based resin is formed on the upper surfaces of the first wiring line 5, the columnar electrode 6 and the foundation insulating film 3 by, for example, the screen printing method or spin coat method so that the thickness of the insulating film 7 is larger than the height of the columnar electrode 6. Thus, in this state, the upper surface of the columnar electrode 6 is covered with the insulating film 7. Then, the upper surface sides of the insulating film 7 and the columnar electrode 6 are properly polished, so that, as shown in FIG. 8, the upper surface of the columnar electrode 6 is exposed from the insulating film 7, and the exposed upper surface of the columnar electrode 6 and the upper surface of the insulating film 7 are flattened.

Figure 9:
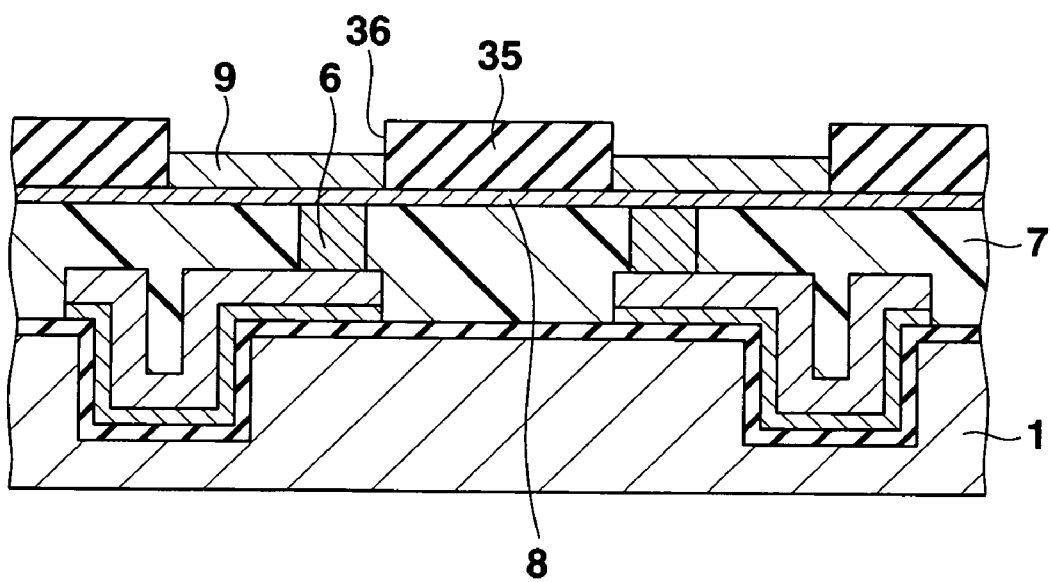
FIG. 9 is a sectional view of an assembly for explaining a step following FIG. 8.

Next, as shown in FIG. 9, the second foundation metal layer 8 made of, for example, copper (to be precise, a single layer to form a plurality of foundation metal layers 8) is formed by, for example, electroless plating all over the upper surface of the columnar electrode 6 and the upper surface of the insulating film 7. Then, a plating resist film 35 is patterned/formed on the upper surface of the second foundation metal layer 8. In this case, an opening 36 is formed in a part of the plating resist film 35 corresponding to the region where the second wiring line 9 is to be formed.

Figure 10:
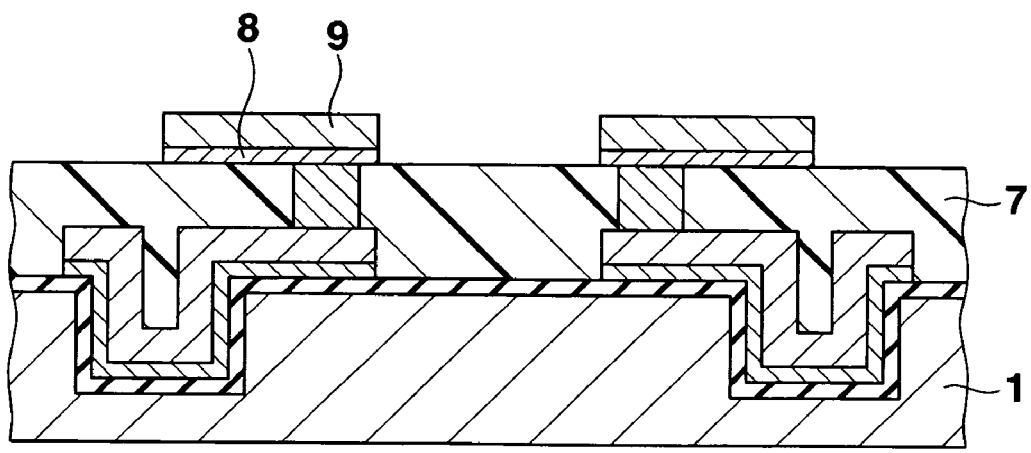
FIG. 10 is a sectional view of an assembly for explaining a step following FIG. 9.

Next, the electrolytic plating of copper is carried out using the second foundation metal layer 8 as a plating current path, such that the second wiring line 9 is formed on the upper surface of the second foundation metal layer 8 within the opening 36 of the plating resist film 35. Subsequently, the plating resist film 35 is released, and unnecessary parts of the second foundation metal layer 8 are then etched and removed using the second wiring line 9 as a mask, so that the second foundation metal layer 8 remains only under the second wiring line 9, as shown in FIG. 10.

Figure 11:
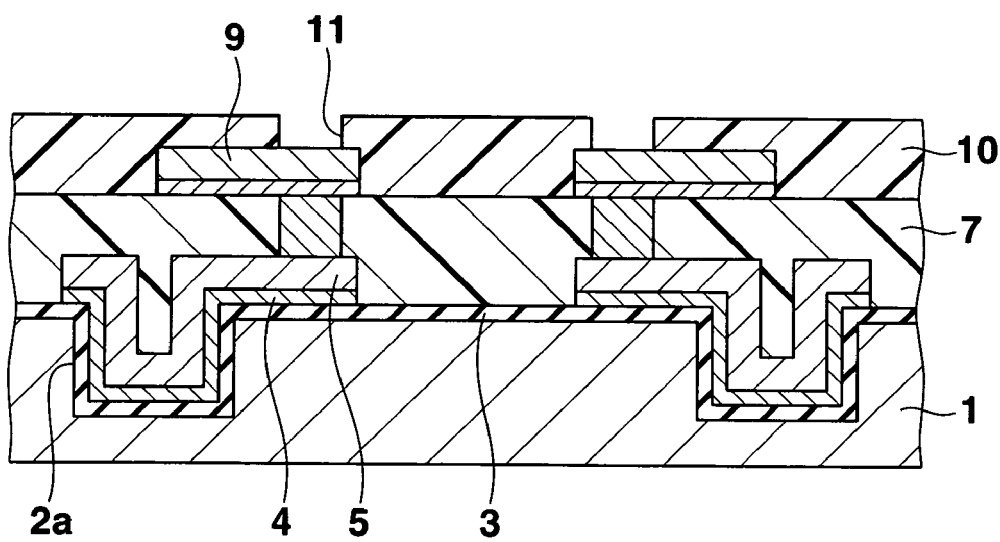
FIG. 11 is a sectional view of an assembly for explaining a step following FIG. 10.

Next, as shown in FIG. 11, the upper overcoat film 10 made of, for example, a solder resist is formed on the upper surfaces of the second wiring line 9 and the insulating film 7 by, for example, the screen printing method or spin coat method. In this case, the openings 11 are formed in the upper overcoat film 10 in parts corresponding to the connection pad portions of the second wiring lines 9.

Figure 12:
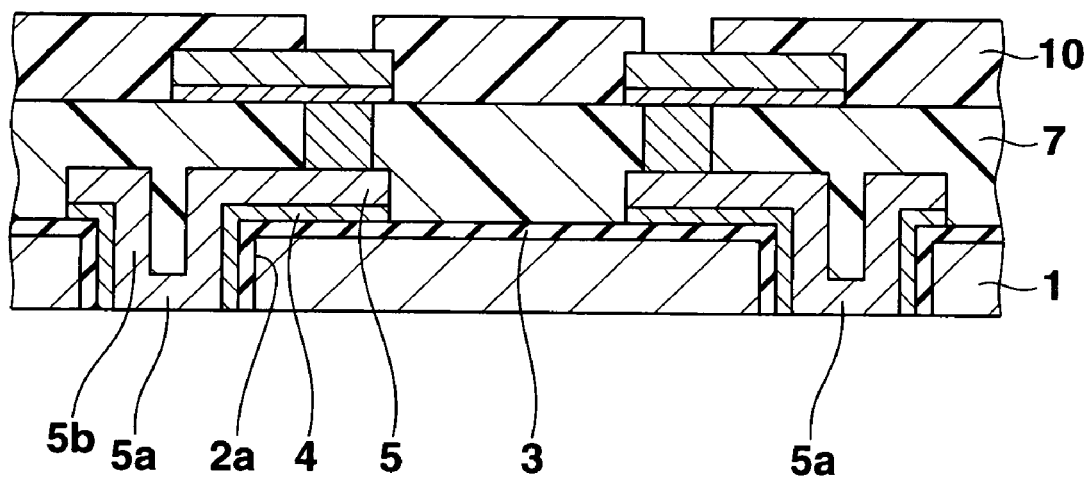
FIG. 12 is a sectional view of an assembly for explaining a step following FIG. 11.

Next, the lower surface of the silicon substrate 1 is polished or etched. The polish or etching processing is continued even after the foundation insulating film 3 and the first foundation metal layer 4 formed within the recess 2a of the silicon substrate 1 are exposed, and finished when the bottom surface or lower surface of the bottomed cylindrical first wiring line 5 formed within the recess 2a is exposed. This step brings a result as shown in FIG. 12. In this state, the through hole 2 created by the remainder of the recess 2a is formed in the silicon substrate 1, and the lower surfaces of the cylindrical foundation insulating film 3, the cylindrical first foundation metal layer 4 and the bottomed cylindrical first wiring line 5 formed within the through hole 2 are flush with the lower surface of the silicon substrate 1. In this case, the lower surface of the bottom portion 5a forming the bottomed cylindrical portion of the first wiring line 5 may be removed together with the silicon substrate 1. However, the purpose of the invention of the present application is to ensure that the bottom portion 5a having a predetermined thickness, preferably, a thickness of 5 to 50 μm remains.

Figure 13:
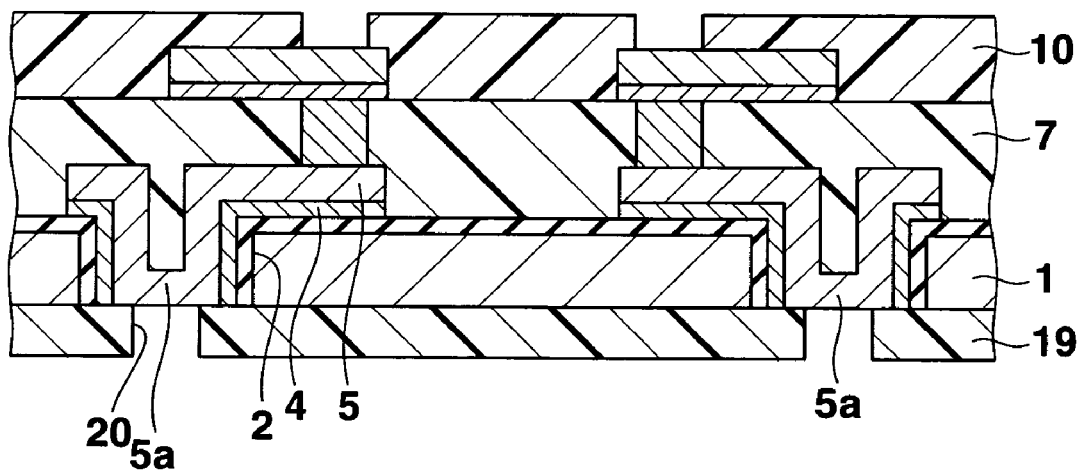
FIG. 13 is a sectional view of an assembly for explaining a step following FIG. 12.

Next, as shown in FIG. 13, the lower overcoat film 19 made of, for example, a solder resist is formed, by, for example, the screen printing method or spin coat method, on the lower surface of the silicon substrate 1 and on the end faces of the foundation insulating film 3 and the first foundation metal layer 4 formed within the through hole 2 of the silicon substrate 1. In this case, the openings 20 are formed in the lower overcoat film 19 in parts corresponding to the bottom portions 5a (connection pad portions) of the bottomed cylindrical portions of the first wiring lines 5 formed within the through holes 2 of the silicon substrate 1. The opening 20 may be sized to expose the entire bottom surface of the first wiring line 5 or may be sized to cover the peripheral edge thereof.

Figure 14:
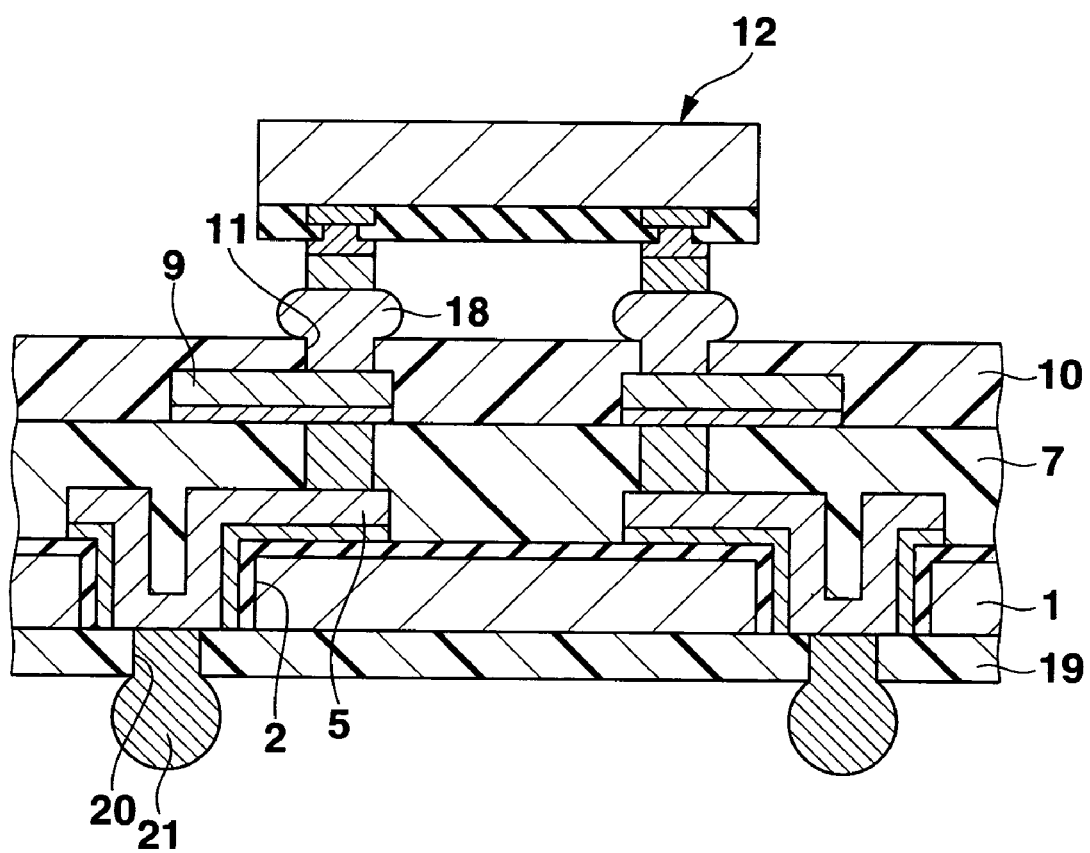
FIG. 14 is a sectional view of an assembly for explaining a step following FIG. 13.

Next, as shown in FIG. 14, the solder balls 21 are formed within and under the openings 20 of the lower overcoat film 19 so that the solder balls 21 are connected to the bottom surface of the bottomed cylindrical portions of the first wiring lines 5 formed within the through holes 2 of the silicon substrate 1. Moreover, the solder balls 18 of the separately manufactured semiconductor construct 12 are bonded to the upper surfaces of the connection pads of the second wiring lines 9 exposed via the openings 11 of the upper overcoat film 10. Then, after a dicing step, a plurality of semiconductor devices shown in FIG. 1 are obtained.

In the semiconductor device thus obtained, because vertical conductors made of the first wiring lines 5 having the bottomed cylindrical portions are provided within the through holes 2 of the silicon substrate 1, the solder balls 21 can be provided in the bottom surfaces of the vertical conductors made of the bottomed cylindrical portions of the first wiring lines 5, so that a lower wiring line as in prior art is no longer necessary, the area of the silicon substrate 1 can be reduced accordingly, and the entire semiconductor device can be reduced in size.

In FIG. 1, the second foundation metal layer 8 and the second wiring line 9 may be omitted, and the solder balls 18 of the semiconductor construct 12 may be directly bonded to the upper surfaces of the columnar electrodes 6 via the openings 11 of the upper overcoat film 10. In this case, the upper overcoat film 10 may be further omitted. Moreover, if the depth of the recess 2a of the silicon substrate 1 is as small as, for example, about 30 to 60 μm, a level difference between the bottom 5a of the bottomed cylindrical portion of the first wiring line 5 and the upper end of the side portion 5b is reduced accordingly, so that the columnar electrode 6 can be formed on the bottomed cylindrical portion of the first wiring line 5, that is, on the bottom 5a thereof, or formed to extend over the bottom 5a and the side portion 5b thereof.

Second Embodiment

Figure 15:
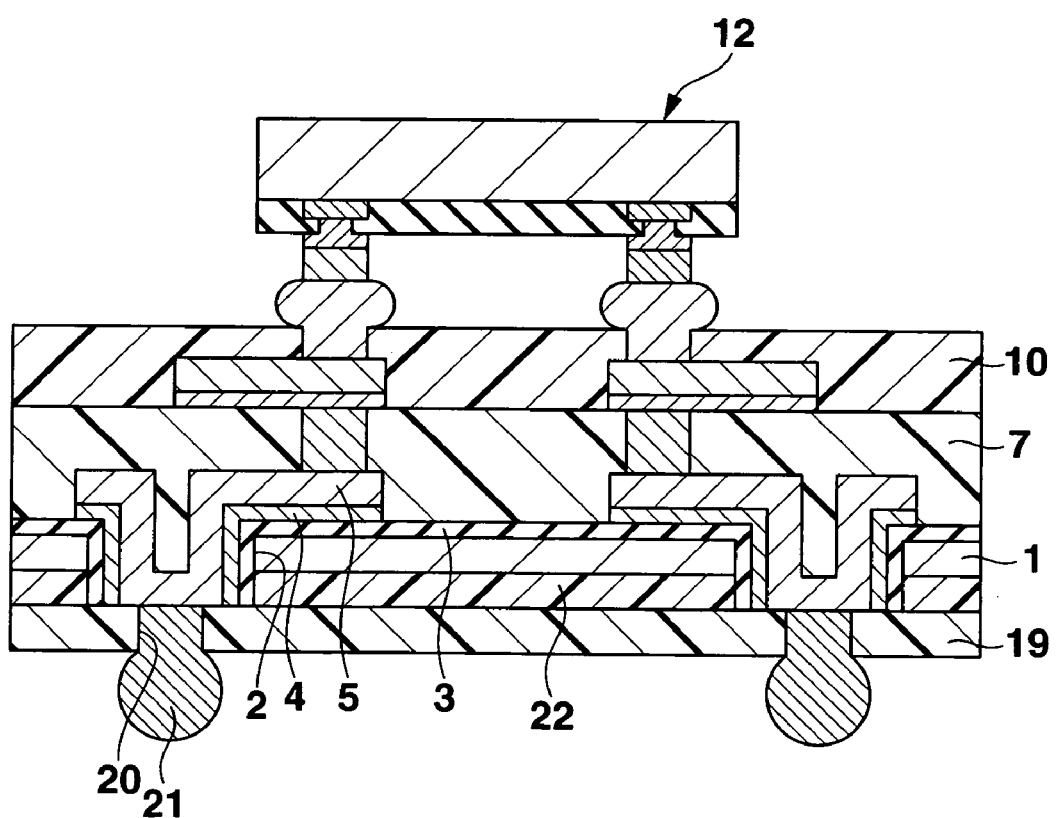
FIG. 15 is a sectional view of a semiconductor device as a second embodiment of this invention.

FIG. 15 shows a sectional view of a semiconductor device as a second embodiment of this invention. This semiconductor device is different from the semiconductor device shown in FIG. 1 in that the thickness of a silicon substrate 1 is reduced, in that a foundation insulating film 3, a first foundation metal layer 4 and a first wiring line 5 which are provided in a through hole 2 of the silicon substrate 1 project from the lower surface side of the silicon substrate 1, and in that a protective film 22 made of, for example, a polyimide-based resin is provided on the lower surface of the silicon substrate 1 so that the lower surface of this protective film 22 is flush with the lower surfaces of the foundation insulating film 3, the first foundation metal layer 4 and the first wiring line 5 which project onto the lower surface side of the silicon substrate 1.

Figure 16:
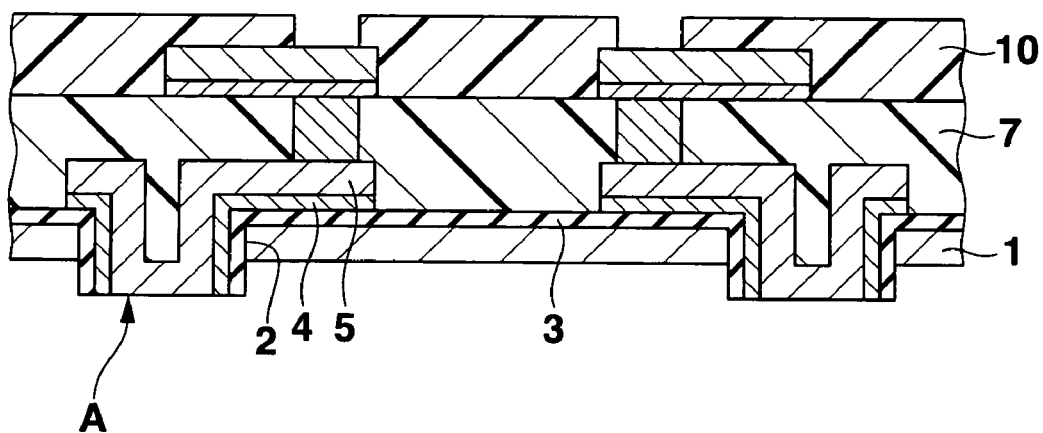
FIG. 16 is a sectional view of an assembly for explaining a predetermined step in one example of a method of manufacturing the semiconductor device shown in FIG. 15.

Next, one example of a method of manufacturing this semiconductor device will be described. First, as shown in FIG. 12, the lower surface sides of the silicon substrate 1, etc. are polished, so that the lower surface of the bottomed cylindrical portion of the first wiring line 5 each formed within the through hole 2 of the silicon substrate 1 is exposed. Then, as shown in FIG. 16, only the lower surface side of the silicon substrate 1 is properly etched using a selecting etching solution such as a hydrofluoric acid to properly reduce the thickness of the silicon substrate 1. In this state, the lower parts of the foundation insulating film 3, the first foundation metal layer 4 and the first wiring line 5 which formed within the through hole 2 of the silicon substrate 1 properly project from the lower surface side of the silicon substrate 1. Each of the projected parts is hereinafter called a projection A for convenience of explanation.

Figure 17:
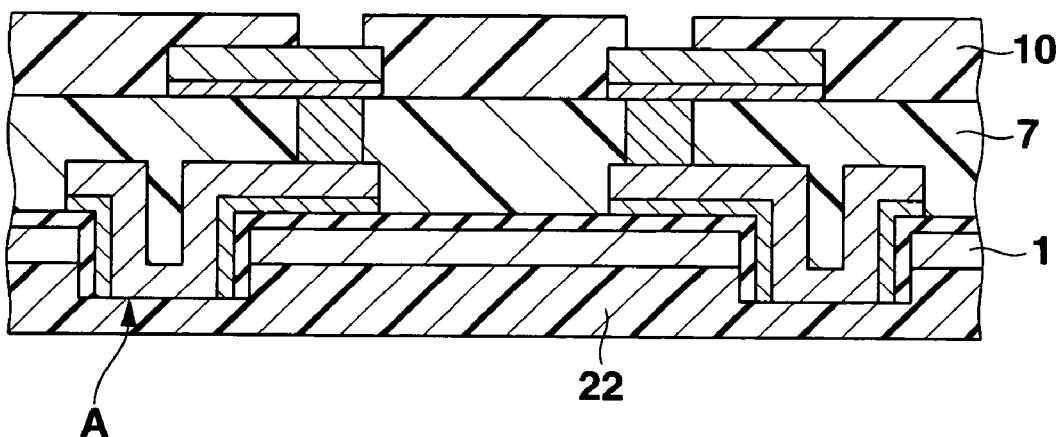
FIG. 17 is a sectional view of an assembly for explaining a step following FIG. 16.
Figure 18:
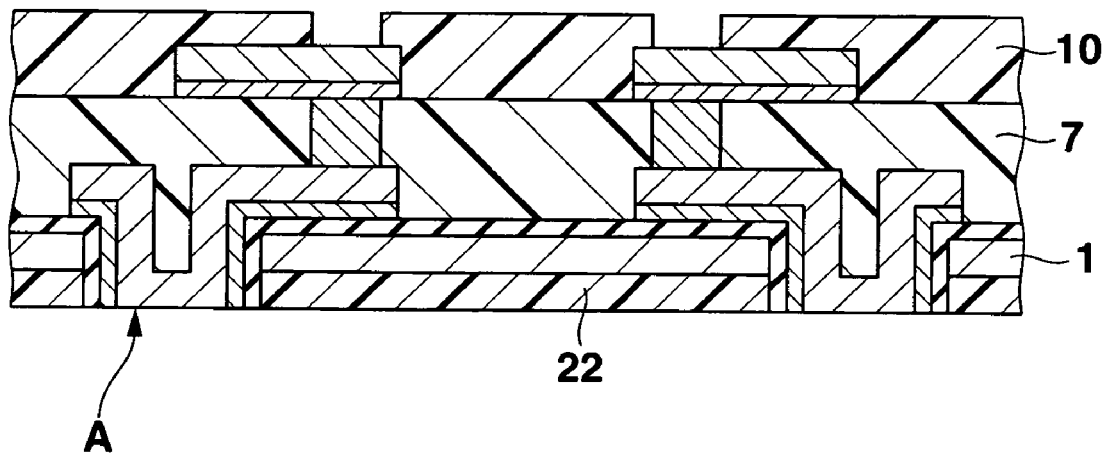
FIG. 18 is a sectional view of an assembly for explaining a step following FIG. 17.

Next, as shown in FIG. 17, by, for example, a screen printing method or spin coat method, the protective film 22 made of, for example, a polyimide-based resin is continuously formed on the lower surfaces of the projections A and the silicon substrate 1 so that the thickness of this protective film 22 is larger than the height of the projections A. Therefore, in this state, the lower surfaces of the projections A are covered with the protective film 22. Then, the lower surface side of the protective film 22 is properly polished or etched to expose the lower surfaces of the projections A and flatten the lower surface of the protective film 22 including this exposed lower surfaces of the projections A, as shown in FIG. 18. Subsequently, dicing is carried out after steps shown in FIGS. 13 and 14, thereby obtaining a plurality of semiconductor devices shown in FIG. 15.

Third Embodiment

Figure 19:
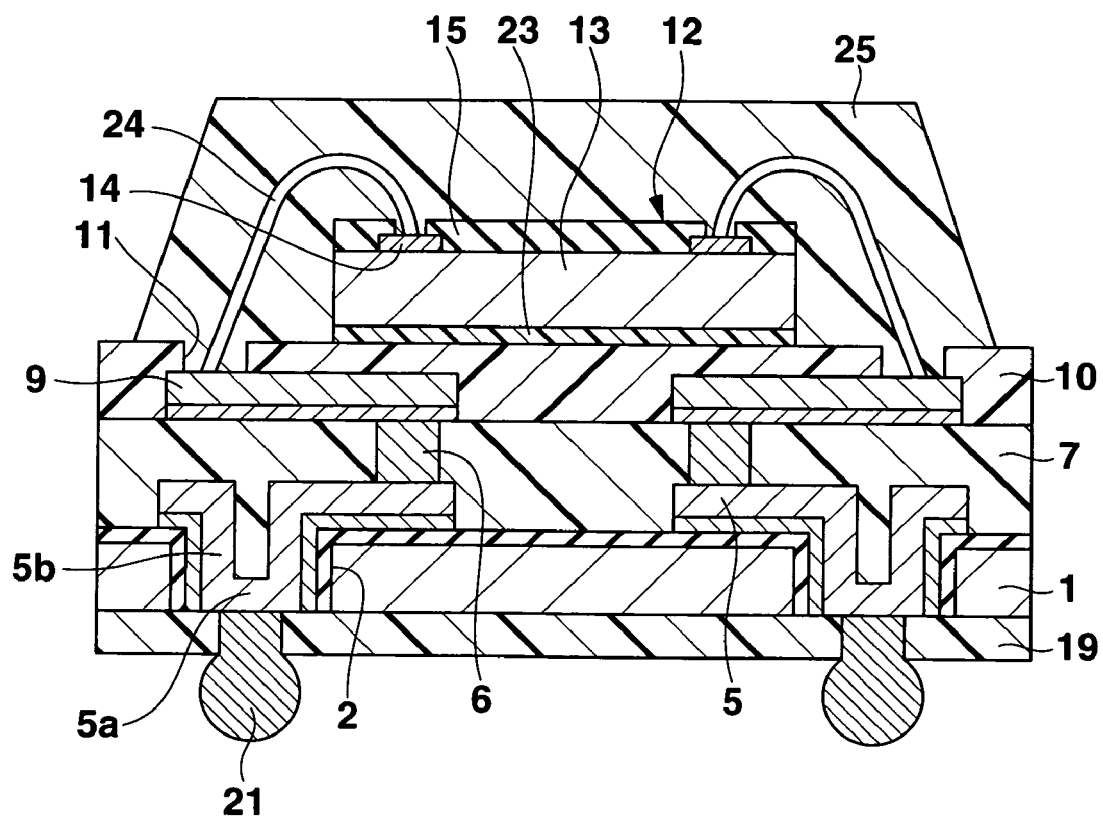
FIG. 19 is a sectional view of a semiconductor device as a third embodiment of this invention.

FIG. 19 shows a sectional view of a semiconductor device as a third embodiment of this invention. The major difference between this semiconductor device and the semiconductor device shown in FIG. 1 is that a semiconductor construct 12 is wire-bonded face up onto an upper overcoat film 10. In this case, the semiconductor construct 12 has a structure without a lower metal layer 16, a lower connection pad 17 and solder balls 18 that are shown in FIG. 1.

Then, the semiconductor construct 12 is adhesively bonded to the upper surface of the upper overcoat film 10 via a adhesive bonding layer 23 made of a die bond material provided on the lower surface of a silicon substrate 13. Connection pads 14 of the semiconductor construct 12 are connected via bonding wires 24 to the upper surfaces of connection pad portions of second wiring lines 9 exposed via openings 11 of the upper overcoat film 10. A sealing material 25 made of, for example, an epoxy-based resin is provided on the upper surfaced of the upper overcoat film 10, the semiconductor construct 12 and the bonding wires 24.

Modification of Third Embodiment

In the third embodiment, the depth of a through hole 2 of a silicon substrate 1 can be reduced, so that a columnar electrode 6 is formed on a bottomed cylindrical portion of a first wiring line 5, that is, on a lower surface of a bottom 5a thereof, or formed to extend over the bottom 5a and side portion 5b thereof. In this case, second wiring lines 9 and an upper overcoat film 10 are not formed, and the upper surface of the columnar electrode 6 is flush with the upper surface of an insulating film 7 and directly exposed to the outside, so that a semiconductor construct 12 can be installed on the insulating film 7 to directly connect the columnar electrode 6 to connection pads 14 of the semiconductor construct 12 by bonding wires 24.

Fourth Embodiment

Figure 20:
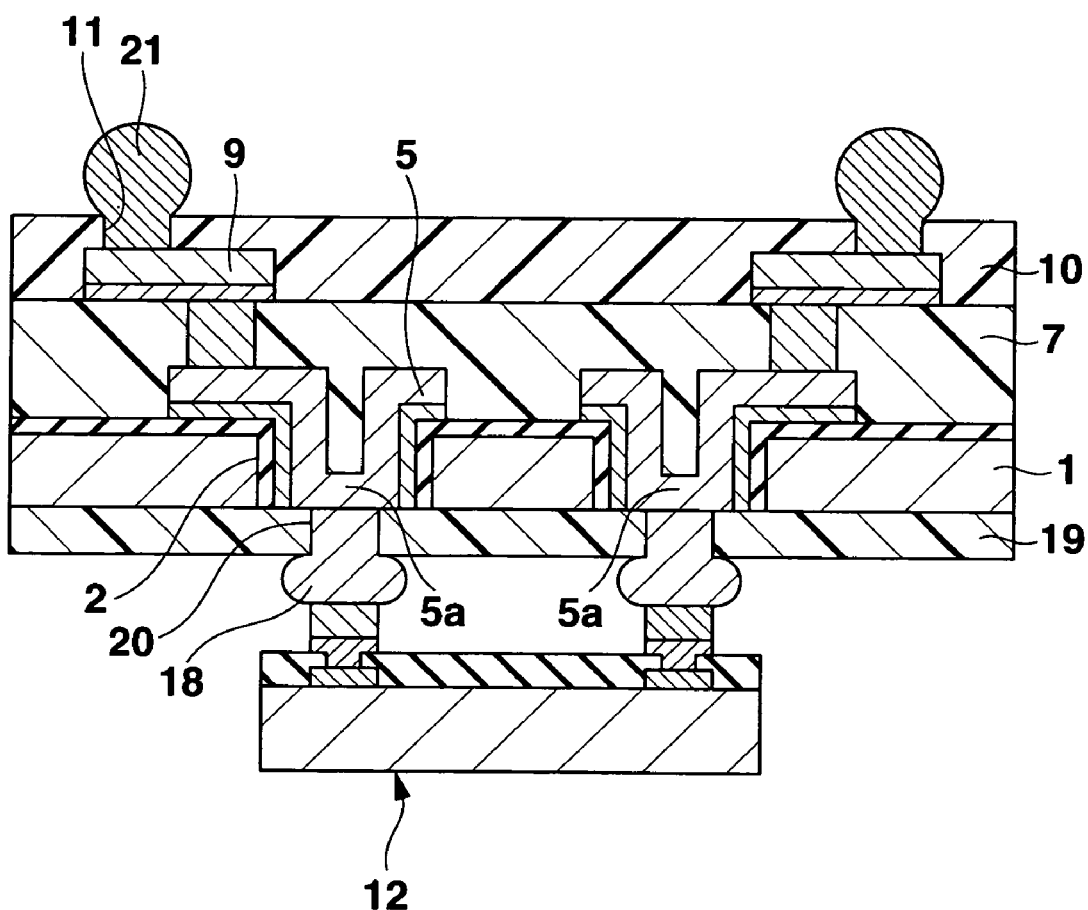
FIG. 20 is a sectional view of a semiconductor device as a fourth embodiment of this invention.

FIG. 20 shows a sectional view of a semiconductor device as a fourth embodiment of this invention. The major difference between this semiconductor device and the semiconductor device shown in FIG. 1 is that solder balls 21 are provided in and above openings 11 of an upper overcoat film 10 so that these solder balls 21 are connected to the upper surfaces of connection pad portions of second wiring lines 9, and that solder balls 18 of a semiconductor construct 12 are bonded to lower surface of bottoms 5a of bottomed cylindrical portions of first wiring lines 5 via openings 20 formed in a lower overcoat film 19 to install the semiconductor construct 12 under the lower overcoat film 19.

Fifth Embodiment

Figure 21:
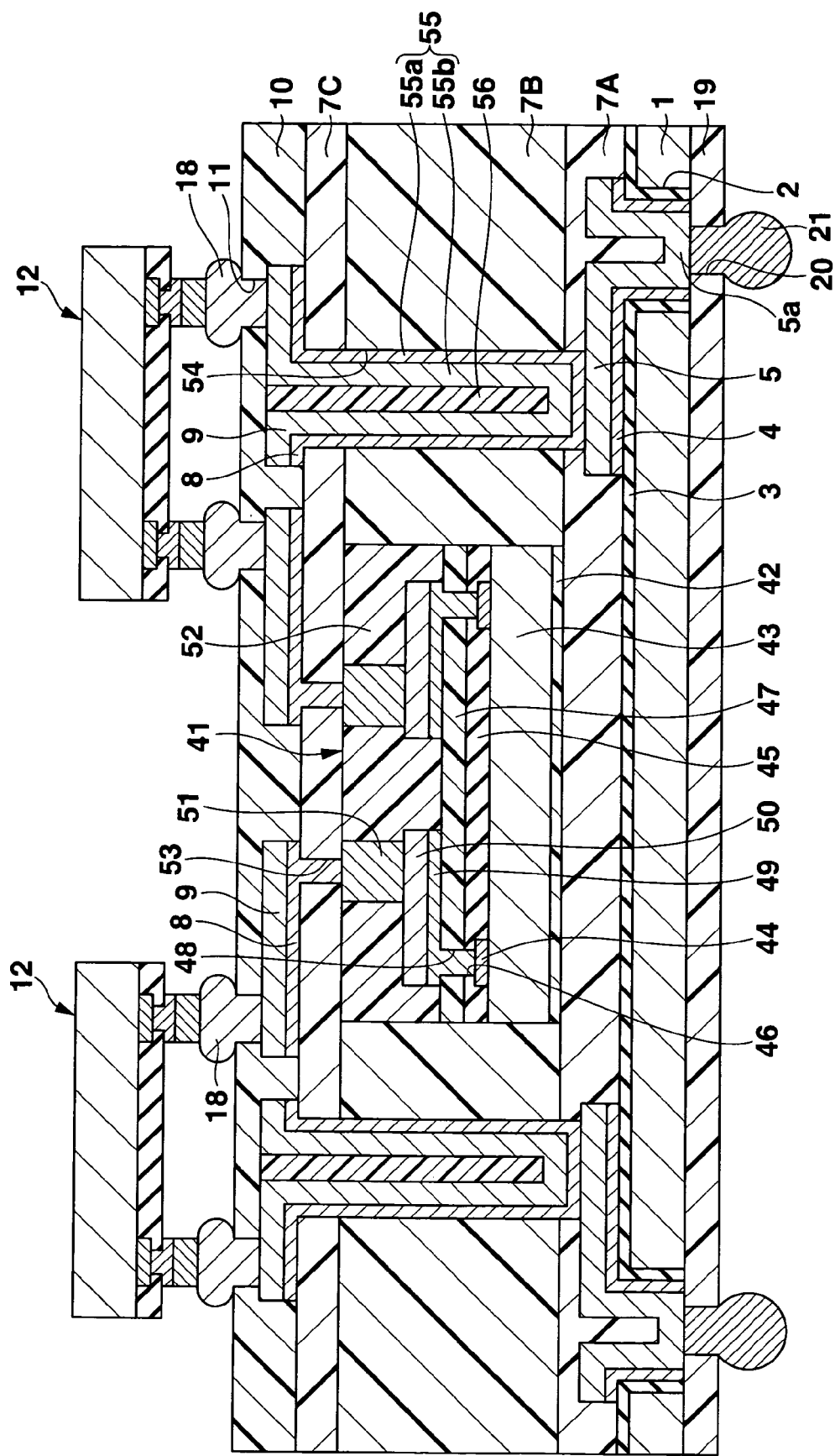
FIG. 21 is a sectional view of a semiconductor device as a fifth embodiment of this invention.

FIG. 21 shows a sectional view of a semiconductor device as a fifth embodiment of this invention. The major difference between this semiconductor device and the semiconductor device shown in FIG. 1 is that a semiconductor construct 41 is provided between a silicon substrate 1 and a second wiring line 9 provided under an upper overcoat film 10, and that a first wiring line 5 is connected to the second wiring line 9 via a vertical conductor 55.

Next, part of this semiconductor device will be described in detail. A first insulating film 7A made of, for example, a polyimide-based resin is provided on the upper surfaces of the first wiring line 5 and a foundation insulating film 3. The lower surface of the planar square semiconductor construct 41 having a size somewhat smaller than the size of the silicon substrate 1 is adhesively bonded to the upper surface of the first insulating film 7A via an adhesive bonding layer 42 made of a die bond material.

The semiconductor construct 41 is what is generally called a chip size package (CSP), and comprises a silicon substrate (semiconductor substrate) 43. The lower surface of the silicon substrate 43 is adhesively bonded to the upper surface of the first insulating film 7A via the above-mentioned adhesive bonding layer 42. An integrated circuit (not shown) having a predetermined function is provided on the upper surface of the silicon substrate 43, and a plurality of connection pads 44 made of, for example, an aluminum-based metal are provided in peripheral parts of the upper surface of the silicon substrate 43 so that these connection pads 44 are connected to the integrated circuit.

An insulating film 45 made of, for example, silicon oxide is provided on the upper surfaces of the connection pads 44 and the silicon substrate 43 except for the centers of the connection pads 44, and the centers of the connection pads 44 are exposed via openings 46 provided in the insulating film 45. A protective film 47 made of, for example, a polyimide-based resin is provided on the upper surface of the insulating film 45. Openings 48 are provided in the protective film 47 in parts corresponding to the openings 46 of the insulating film 45.

A foundation metal layer 49 made of, for example, copper is partly provided on the upper surface of the protective film 47. A wiring line 50 made of copper is provided all over the upper surface of each of the foundation metal layers 49. One end of the foundation metal layer 49 is connected to the connection pad 44 via the openings 46 and 48 of the insulating film 45 and the protective film 47. As a result, the wiring line 50 is electrically connected to the connection pad 44. A columnar electrode 51 made of copper is provided on the upper surface of the connection pad portion of the wiring line 50. A sealing film 52 made of, for example, an epoxy-based resin is provided on the upper surfaces of the wiring line 50 and the protective film 47 so that the upper surface of this sealing film 52 is flush with the upper surface of the columnar electrode (external connection electrode) 51.

A square frame-like second insulating film 7B is provided on the upper surface of the first insulating film 7A on the periphery of the semiconductor construct 41. The second insulating film 7B is made of, for example, a thermosetting resin such as an epoxy-based resin or a polyimide-based resin in which a reinforcing material made of an inorganic material such as a silica filler is dispersed, or is only made of a thermosetting resin such as an epoxy-based resin.

A third insulating film 7C is provided on the upper surfaces of the semiconductor construct 41 and the second insulating film 7B so that the upper surface of this third insulating film 7C is flat. The third insulating film 7C is made of, for example, a base material made of, for example, glass cloth or glass fiber impregnated with a thermosetting resin such as an epoxy-based resin or a polyimide-based resin, or is only made of a thermosetting resin such as an epoxy-based resin.

Openings 53 are provided in the third insulating film 7C in parts corresponding to the centers of the upper surfaces of the columnar electrodes 51 of the semiconductor construct 41. A second foundation metal layer 8 and a second wiring line 9 are partly provided on the upper surface of the third insulating film 7C. One end of the second foundation metal layer 8 is connected to the upper surface of the columnar electrode 51 of the semiconductor construct 41 via the opening 53 of the third insulating film 7C. As a result, the second wiring line 9 is electrically connected to the columnar electrode 51.

The upper overcoat film 10 is provided on the upper surfaces of the second wiring line 9 and the third insulating film 7C. Openings 11 are provided in the upper overcoat film 10 in parts corresponding to connection pad portions of the second wiring lines 9. Solder balls 18 of a semiconductor construct 12 are bonded to the upper surfaces of the connection pad portions of the second wiring lines 9 via the openings 11 of the upper overcoat film 10, such that the semiconductor construct 12 is installed on the upper overcoat film 10.

The first wiring line 5 is connected to at least part of the second wiring lines 9 via the cylindrical vertical conductor 55 including a foundation metal layer 55a made of, for example, copper and a copper layer 55b which are provided on the inner wall surface of an opening formed through the first to third insulating films 7A, 7B and 7C. A filling material 56 made of, for example, a solder resist is filled in a cylindrical space of the vertical conductor 55.

Figure 22:
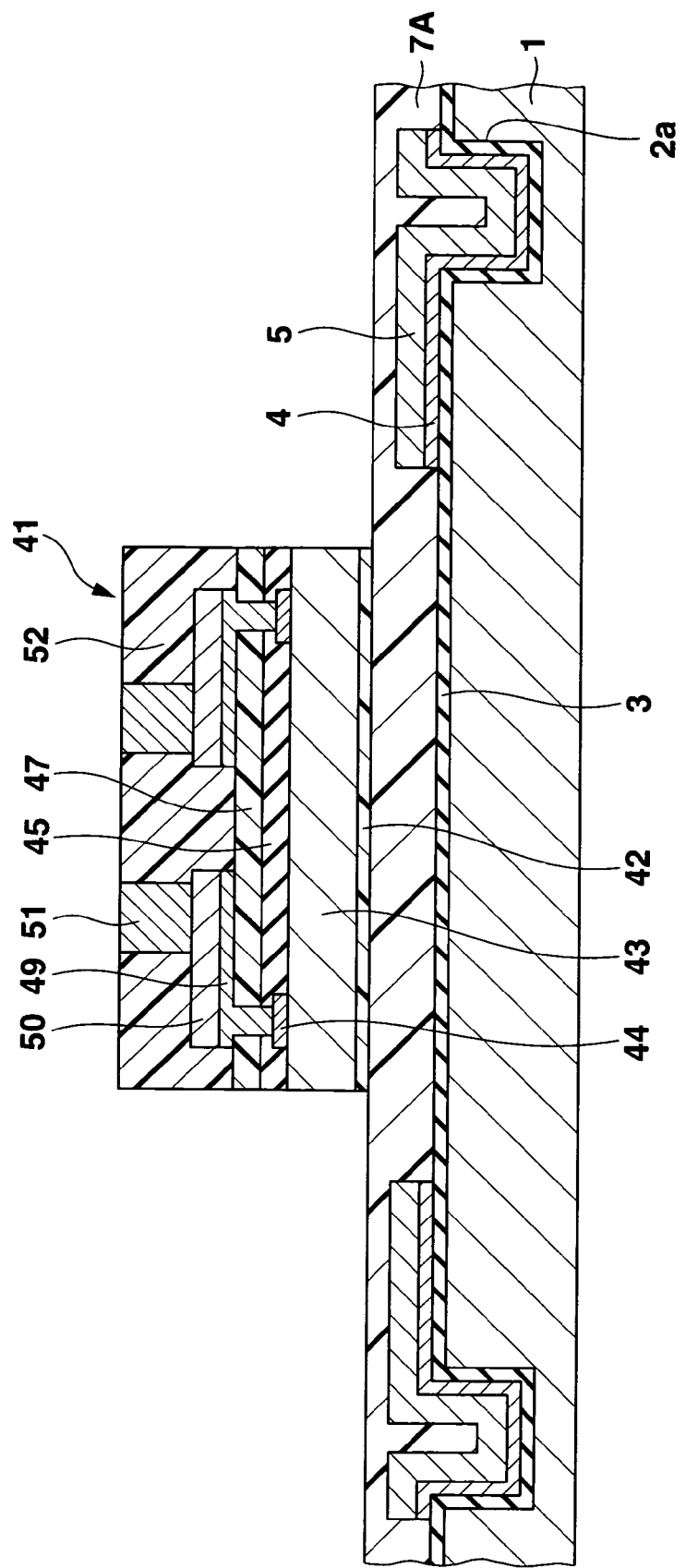
FIG. 22 is a sectional view of an initially prepared material in one example of a method of manufacturing the semiconductor device shown in FIG. 21.

Next, one example of a method of manufacturing this semiconductor device will be described. First, as shown in FIG. 22, there is prepared a material in which recesses 2a are formed in regions where through holes 2 are formed in the upper surface of the simple silicon substrate 1 in a wafer state, the foundation insulating film 3 is formed on the upper surface of the silicon substrate 1 including the insides of the recesses 2a, a first foundation metal layer 4 and the first wiring line 5 are formed on the upper surface of the foundation insulating film 3 including the insides of the recesses 2a, and the first insulating film 7A is formed on the upper surface of the foundation insulating film 3 including the first wiring line 5. In this case as well, the thickness of the silicon substrate 1 in the wafer state is somewhat lager than the thickness of the silicon substrate 1 shown in FIG. 21.

Furthermore, there is prepared an assembly in which the adhesive bonding layer 42 is provided on the lower surface of the silicon substrate 43 of the semiconductor construct 41. In this case, the semiconductor construct 41 having the adhesive bonding layer 42 is obtained in the following manner: the connection pads 44, the insulating film 45, the protective film 47, the foundation metal layers 49, the wiring lines 50, the columnar electrodes 51 and the sealing film 52 are formed on the silicon substrate 43 in a wafer state; and the adhesive bonding layer 42 made of a die bond material such as an epoxy-based resin or a polyimide-based resin commercially available as a die attachment film is then fixedly attached in a semi-hardened state by heating and pressurization to the lower surface of the silicon substrate 43 in the wafer state; and these are divided into pieces by dicing.

Next, the adhesive bonding layers 42 fixedly attached to the lower surfaces of the silicon substrates 43 of a plurality of semiconductor constructs 41 are adhesively bonded separately from each other to a plurality of predetermined places on the upper surface of the first insulating film 7A. The adhesive bonding here is achieved by the full hardening of the adhesive bonding layers 42 through heating and pressurization.

Figure 23:
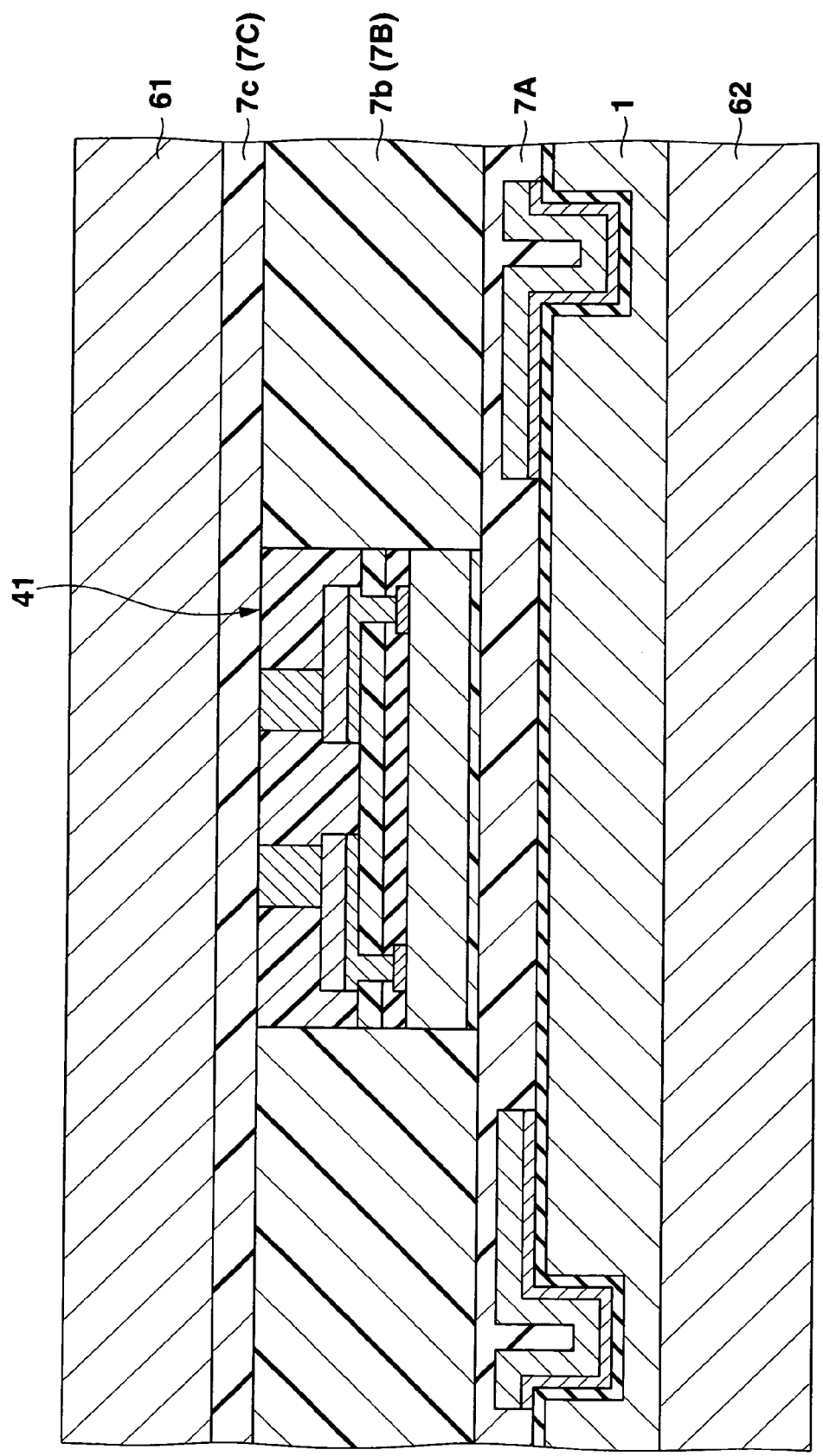
FIG. 23 is a sectional view of an assembly for explaining a step following FIG. 22.

Next, as shown in FIG. 23, a second lattice-shaped insulating film forming sheet 7b is disposed on the upper surface of the first insulating film 7A on the periphery of the semiconductor construct 41 while being positioned by, for example, pins. The second lattice-shaped insulating film forming sheet 7b is formed by dispersing a reinforcing material into a thermosetting resin, semi-hardening the thermosetting resin, and forming it into a sheet.

Next, a third insulating film forming sheet 7c is disposed on the upper surfaces of the semiconductor construct 41 and the second insulating film forming sheet 7b. The third insulating film forming sheet 7c is formed by impregnating a thermosetting resin such as an epoxy-based into, for example, glass cloth, and semi-hardening the thermosetting resin and forming it into a sheet.

Next, the second insulating film forming sheet 7b and the third insulating film forming sheet 7c are heated and pressurized from the top and bottom by use of a pair of heating/pressurization plates 61 and 62. Then, by the subsequent cooling, the second insulating film 7B is formed on the upper surface of the first insulating film 7A around the periphery of the semiconductor construct 41, and the third insulating film 7C is formed on the upper surfaces of the semiconductor construct 41 and the second insulating film 7B. In this case, the upper surface of the third insulating film 7C is held down by the lower surface of the upper heating/pressurization plate 61 and is therefore a flat surface. Thus, there is no necessity of a polishing step for flattening the upper surface of the third insulating film 7C.

Figure 24:
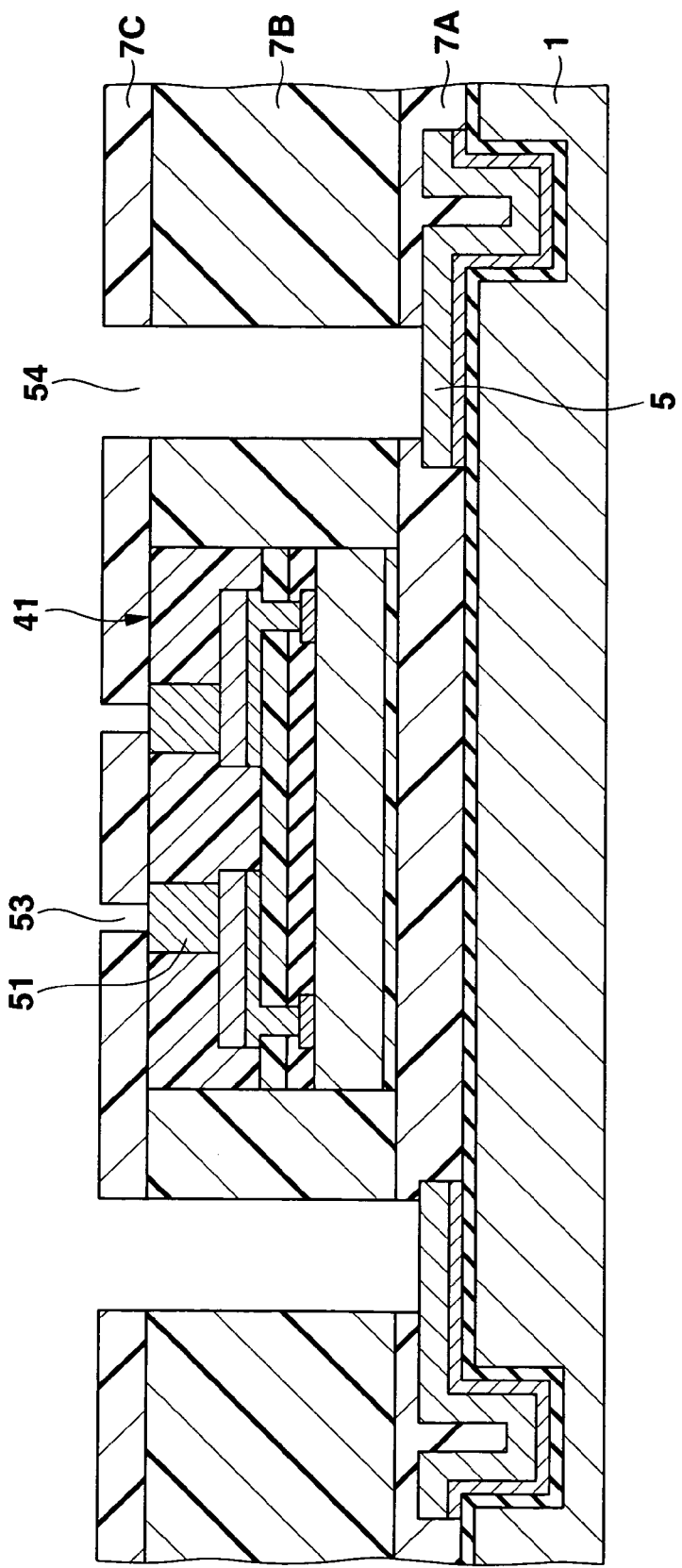
FIG. 24 is a sectional view of an assembly for explaining a step following FIG. 23.

Next, as shown in FIG. 24, the opening 53 is formed in the third insulating film 7C in a part corresponding to the center of the upper surface of the columnar electrode 51 of the semiconductor construct 41 by laser processing in which a laser beam is applied. Further, the opening 54 is formed in the first to third insulating films 7A, 7B and 7C in a part corresponding to the upper surface of the connection pad portion of the first wiring line 5 by use of a mechanical drill. Then, as required, epoxy smear or the like produced in the openings 53 and 54, etc. is removed by a desmear treatment.

Figure 25:
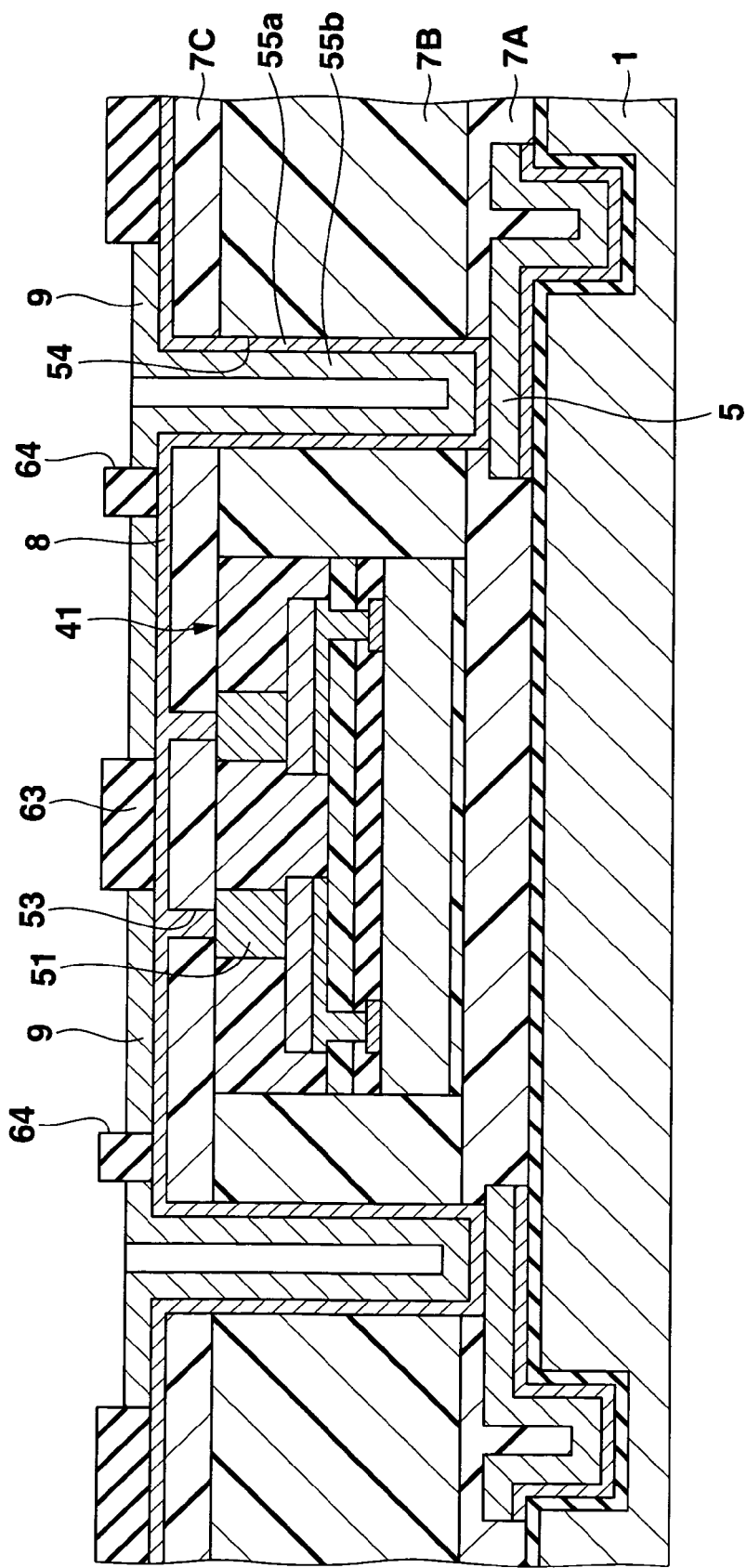
FIG. 25 is a sectional view of an assembly for explaining a step following FIG. 24.

Next, as shown in FIG. 25, the second foundation metal layer 8 and the foundation metal layer 55a are formed by the electroless plating of copper all over the upper surface of the columnar electrode 51 exposed via the opening 53 and the upper surface of the third insulating film 7C including the upper surface of the connection pad portion of the first wiring line 5 exposed via the opening 54. Then, a plating resist film 63 is patterned/formed on the upper surface of the second foundation metal layer 8. In this case, openings 64 are formed in the plating resist film 63 in parts corresponding to the regions where the second wiring lines 9 including the openings 54 are to be formed.

Figure 26:
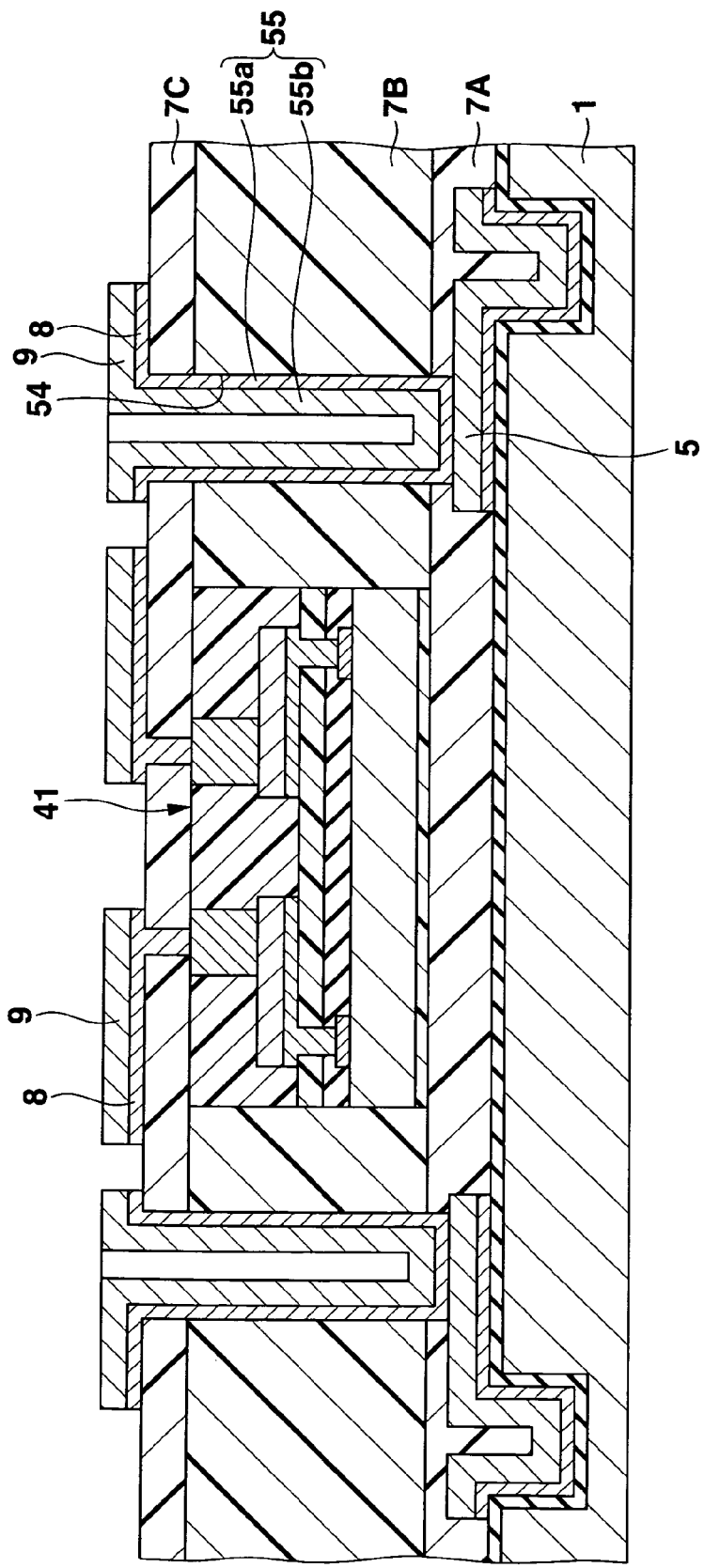
FIG. 26 is a sectional view of an assembly for explaining a step following FIG. 25.

Next, the electrolytic plating of copper is carried out using the foundation metal layers 8 and 55a as plating current paths, such that the second wiring line 9 is formed on the upper surface of the second foundation metal layer 8 within the opening 64 of the plating resist film 63, and the copper layer 55b is formed on the surface of the foundation metal layer 55a within the opening 54. Subsequently, the plating resist film 63 is released, and unnecessary parts of the second foundation metal layer 8 are etched and removed using the second wiring line 9 as a mask, so that the second foundation metal layer 8 remains only under the second wiring line 9, as shown in FIG. 26. In this state, the vertical conductor 55 including the foundation metal layer 55a and the copper layer 55b is formed on the inner wall surface of the opening 54 so that this vertical conductor 55 is connected to the upper surface of the connection pad portion of the first wiring line 5.

Figure 27:
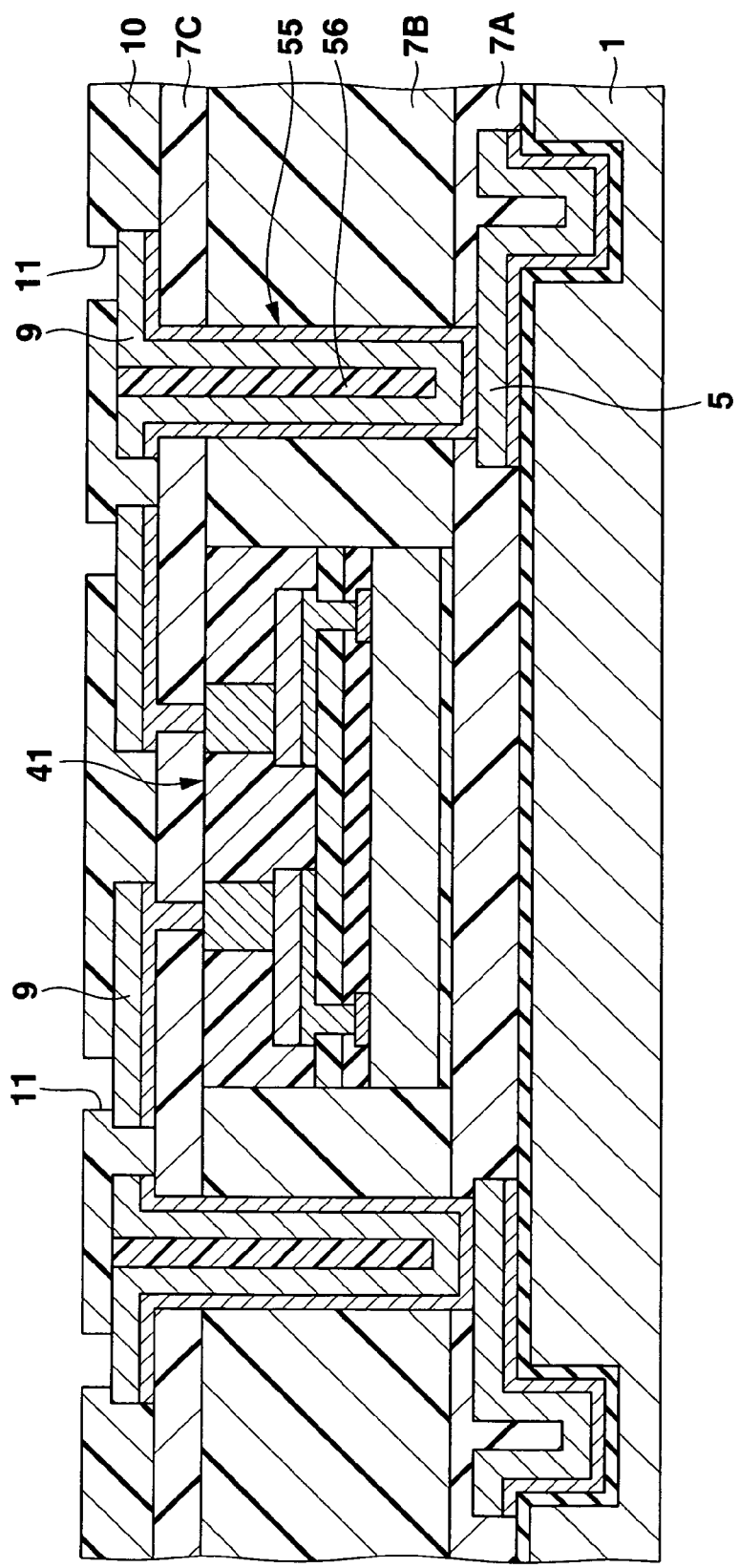
FIG. 27 is a sectional view of an assembly for explaining a step following FIG. 26.

Next, as shown in FIG. 27, the upper overcoat film 10 made of, for example, a solder resist is formed on the upper surface of the third insulating film 7C including the second wiring line 9 by, for example, a screen printing method or spin coat method, and at the same time, the filling material 56 made of, for example, a solder resist is filled in the vertical conductor 55. In this case, the openings 11 are formed in the upper overcoat film 10 in parts corresponding to the connection pad portions of the second wiring lines 9.

Figure 28:
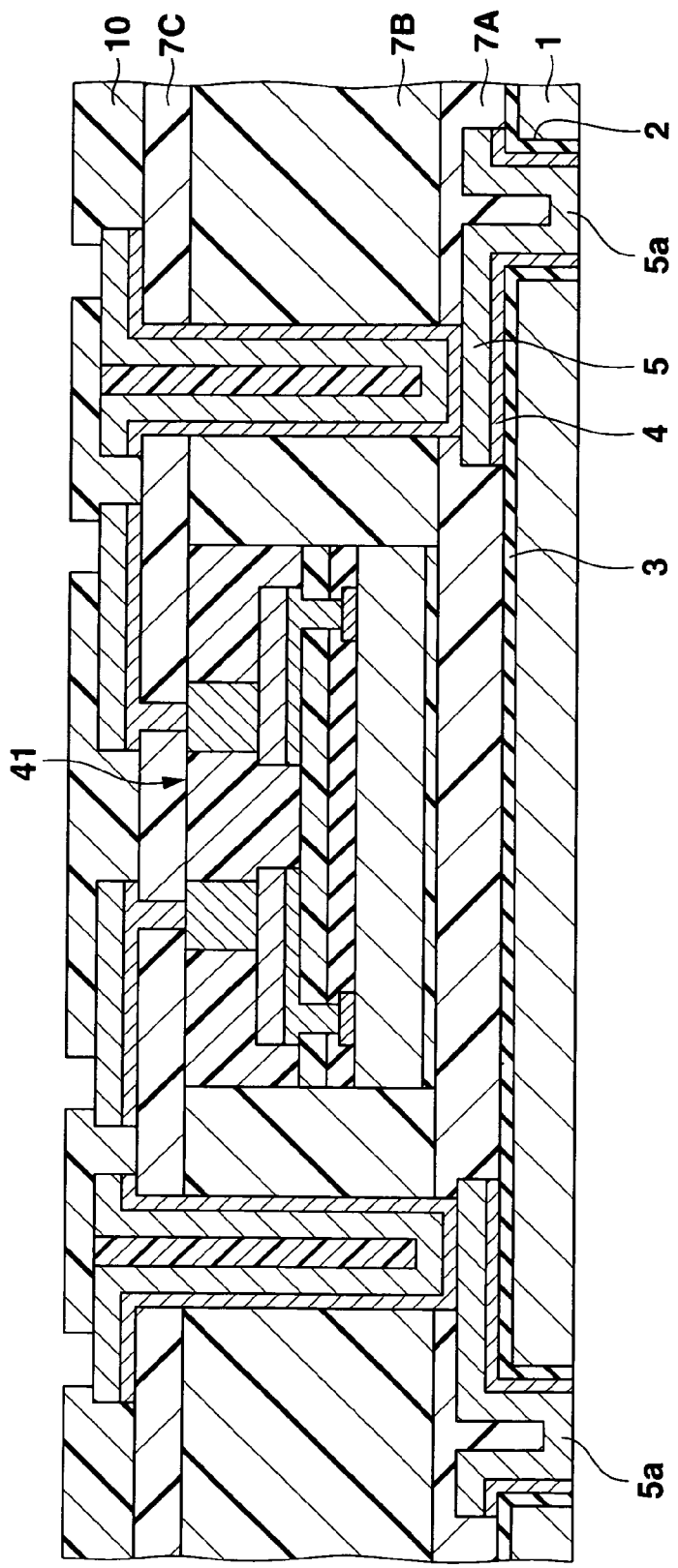
FIG. 28 is a sectional view of an assembly for explaining a step following FIG. 27.

Next, the lower surface side of the silicon substrate 1 including the foundation insulating film 3 and the first foundation metal layer 4 formed within the recess 2a of the silicon substrate 1 is polished and etched until at least the lower surface of a bottomed cylindrical portion of the first wiring line 5 formed within the recess 2a is exposed, thus resulting in a state shown in FIG. 28. In this state, the through holes 2 created by the remainder of the recesses 2a are formed in the silicon substrate 1, and the foundation insulating film 3, the first foundation metal layer 4 and a bottom 5a of the bottomed cylindrical portion of the first wiring line 5 formed within the through hole 2 are flush with the lower surface of the silicon substrate 1.

Figure 29:
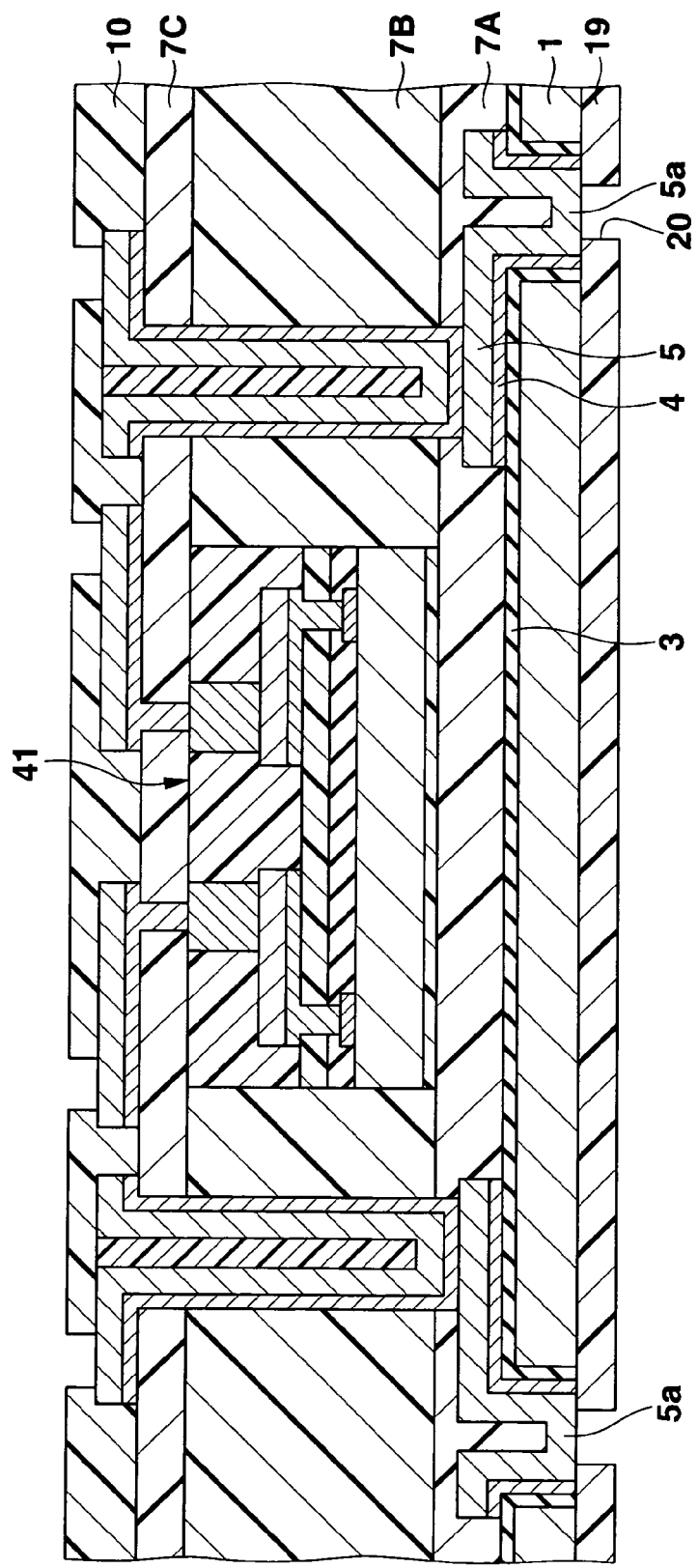
FIG. 29 is a sectional view of an assembly for explaining a step following FIG. 28.

Next, as shown in FIG. 29, a lower overcoat film 19 made of, for example, a solder resist is formed, by, for example, the screen printing method or spin coat method, on the lower surface of the silicon substrate 1 including the lower surfaces of the foundation insulating film 3, the first foundation metal layer 4 and the first wiring line 5 exposed via the through holes 2 of the silicon substrate 1. In this case, openings 20 are formed in the lower overcoat film 19 in parts corresponding to the bottoms 5a of the bottomed cylindrical portions of the first wiring lines 5 formed within the through holes 2 of the silicon substrate 1.

Figure 30:
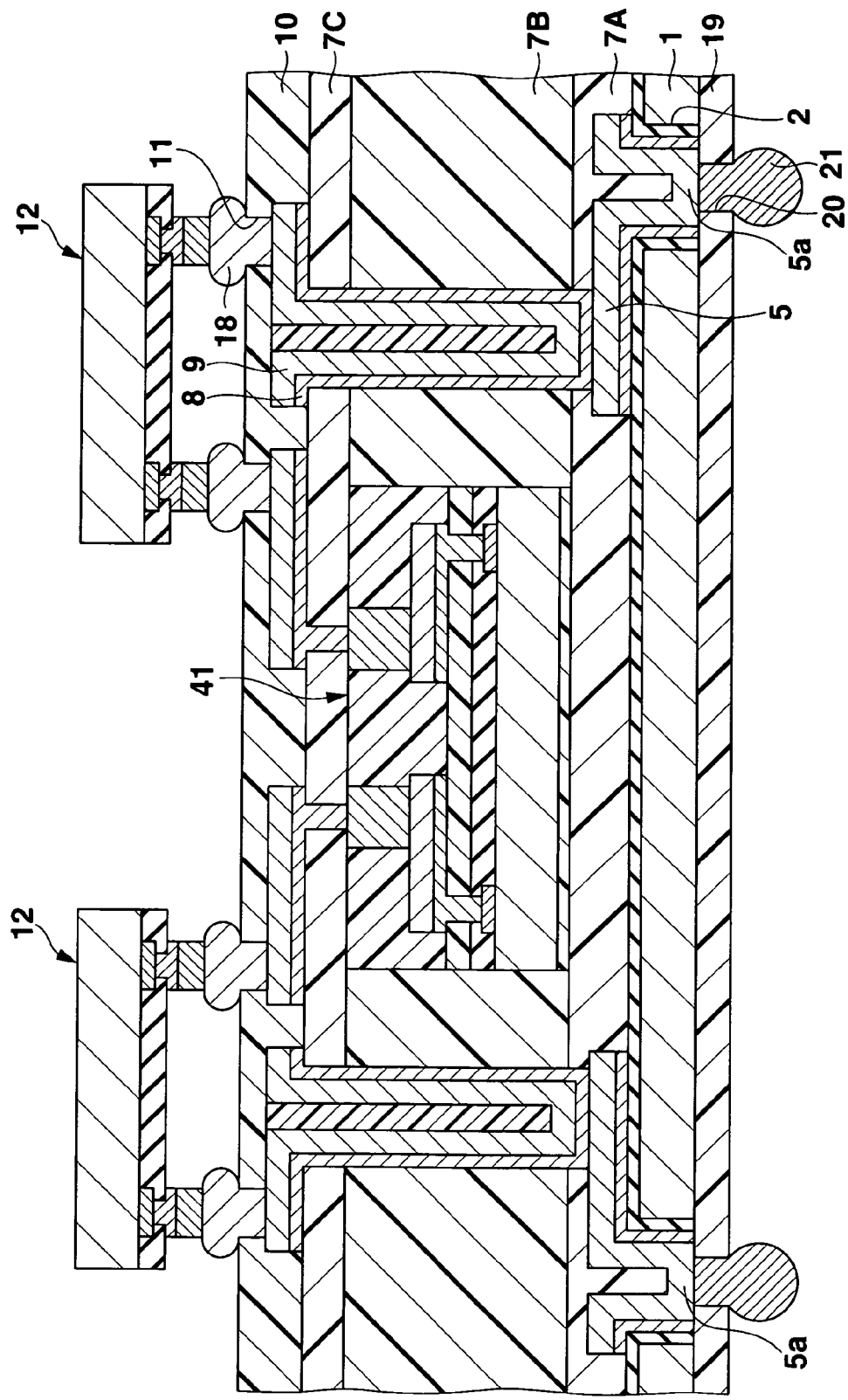
FIG. 30 is a sectional view of an assembly for explaining a step following FIG. 29.

Next, as shown in FIG. 30, solder balls 21 are formed within and under the openings 20 of the lower overcoat film 19 so that the solder balls 21 are connected to the lower surface of the bottoms 5a of the bottomed cylindrical portions of the first wiring lines formed within the through holes 2 of the silicon substrate 1. Moreover, the solder balls 18 of the separately manufactured semiconductor construct 12 are bonded to the upper surfaces of the connection pads of the second wiring lines 9 exposed via the openings 11 of the upper overcoat film 10. Then, a dicing step is executed to obtain a plurality of semiconductor devices shown in FIG. 21. In this case, the semiconductor construct 12 may be bonded to each of the semiconductor devices after dicing, without bonding the semiconductor construct 12 before dicing.

The case has been described in which the semiconductor construct 41 has the sealing film 52 and has the columnar electrodes 51 as external connection electrodes, but this is not a limitation. For example, without having the sealing film 52 and the columnar electrodes 51, the semiconductor construct 41 may have the wiring line 50 with connection pad portions as the external connection electrodes. In this case, the semiconductor construct 41 may have an overcoat film covering all but the connection pad portion of the wiring line 50, and may further have, on the overcoat film, upper connection pads connected to the connection pad portions of the wiring line 50.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A circuit board comprising:
    a semiconductor substrate which includes a plurality of through holes passing from an upper surface to a lower surface thereof;
    at least one foundation insulating film formed on the upper surface of the semiconductor substrate and on inner peripheral surfaces of the through holes;
    a plurality of foundation metal layers formed on the at least one foundation insulating film in the through holes and on the upper surface of the semiconductor substrate;
    a plurality of first wiring lines which are provided on the foundation metal layers on an upper side of the semiconductor substrate, and which have bottomed cylindrical portions located in at least lower parts of the through holes, wherein bottoms of the bottomed cylindrical portions of the first wiring lines constitute connection pad portions;
    a plurality of solder balls provided on lower surfaces of the connection pad portions of the first wiring lines;
    a plurality of columnar electrodes provided on the first wiring lines on the upper side of the semiconductor substrate;
    an insulating film provided between the columnar electrodes on the semiconductor substrate and in inner spaces of the bottomed cylindrical portions of the first wiring lines in the through holes; and
    a plurality of second wiring lines which are provided on the insulating film and which are connected to the columnar electrodes.

2. The circuit board according to claim 1, wherein the bottoms of the bottomed cylindrical portions of the first wiring lines are flush with the lower surface of the semiconductor substrate.

3. The circuit board according to claim 1, wherein the bottoms of the bottomed cylindrical portions of the first wiring lines in the lower parts of the through holes outwardly project from a lower surface side of the semiconductor substrate, and wherein a protective film is provided on the lower surface of the semiconductor substrate.

4. The circuit board according to claim 1, further comprising a lower overcoat film covering the lower surface of the semiconductor substrate, and the bottoms of the bottomed cylindrical portions of the the first wiring lines except for parts where the solder balls are provided.

5. A semiconductor device comprising:
    (i) a circuit board which includes:
        a semiconductor substrate which includes a plurality of through holes passing from an upper surface to a lower surface thereof,
        at least one foundation insulating film formed on the upper surface of the semiconductor substrate and on inner peripheral surfaces of the through holes,
        a plurality of foundation metal layers formed on the at least one foundation insulating film in the through holes and on the upper surface of the semiconductor substrate,
        a plurality of first wiring lines which are provided on the foundation metal layers on an upper side of the semiconductor substrate, and which have bottomed cylindrical portions located in at least lower parts of the through holes, wherein bottoms of the bottomed cylindrical portions of the first wiring lines constitute connection pad portions,
        a plurality of solder balls provided on lower surfaces of the connection pad portions of the first wiring lines,
        a plurality of columnar electrodes provided on the first wiring lines on the upper side of the semiconductor substrate,
        an insulating film provided between the columnar electrodes on the semiconductor substrate and in inner spaces of the bottomed cylindrical portions of the first wiring lines in the through holes, and
        a plurality of second wiring lines which are provided on the insulating film and which are connected to the columnar electrodes; and
    (ii) a semiconductor construct mounted on the circuit board and electrically connected to the columnar electrodes.

6. The semiconductor device according to claim 5, wherein the semiconductor construct is connected to the columnar electrodes via bonding wires.

7. The semiconductor device according to claim 5, wherein the bottoms of the bottomed cylindrical portions of the first wiring lines are flush with the lower surface of the semiconductor substrate.

8. The semiconductor device according to claim 5, further comprising a lower overcoat film covering the lower surface of the semiconductor substrate, and the bottoms of the bottomed cylindrical portions of the the first wiring lines except for parts where the solder balls are provided.

9. The semiconductor device according to claim 7, further comprising a lower overcoat film covering the lower surface of the semiconductor substrate, and the bottoms of the bottomed cylindrical portions of the the first wiring lines except for parts where the solder balls are provided.

10. The semiconductor device according to claim 2, further comprising a lower overcoat film covering the lower surface of the semiconductor substrate, and the bottoms of the bottomed cylindrical portions of the the first wiring lines except for parts where the solder balls are provided.

* * * * *